United States Patent
Chang

(10) Patent No.: US 10,522,387 B2
(45) Date of Patent: Dec. 31, 2019

(54) SEMICONDUCTOR DEVICE AND MULTI-WAFER DEPOSITION APPARATUS

(71) Applicant: Taiwan Semiconductor Manufacturing Company, Ltd., Hsinchu (TW)

(72) Inventor: Yung-Chang Chang, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/693,741

(22) Filed: Sep. 1, 2017

(65) Prior Publication Data
US 2018/0174885 A1 Jun. 21, 2018

Related U.S. Application Data

(60) Provisional application No. 62/434,864, filed on Dec. 15, 2016.

(51) Int. Cl.
*H01L 21/687* (2006.01)
*H01L 29/66* (2006.01)
*H01L 21/78* (2006.01)

(52) U.S. Cl.
CPC .. *H01L 21/68764* (2013.01); *H01L 21/68735* (2013.01); *H01L 21/68771* (2013.01); *H01L 21/78* (2013.01); *H01L 29/66795* (2013.01)

(58) Field of Classification Search
CPC .......... H01L 21/68764; H01L 21/68735; H01L 21/68771; H01L 29/66795; H01L 21/78
See application file for complete search history.

(56) References Cited

U.S. PATENT DOCUMENTS

| 4,284,033 | A | * | 8/1981 | del Rio | C23C 14/505 118/730 |
| 4,482,419 | A | * | 11/1984 | Tsukada | H01J 37/16 156/345.31 |
| 5,407,314 | A | * | 4/1995 | Kempf | C23C 14/56 414/217 |
| 5,782,979 | A | * | 7/1998 | Kaneno | C23C 16/301 118/500 |
| 5,788,777 | A | * | 8/1998 | Burk, Jr. | C23C 16/4584 118/730 |
| 9,230,846 | B2 | | 1/2016 | Celaru et al. | |
| 2003/0029384 | A1 | * | 2/2003 | Nishikawa | C23C 16/4584 118/730 |

(Continued)

FOREIGN PATENT DOCUMENTS

| JP | 2013147677 A | 8/2013 |
| KR | 20130039737 A | 4/2013 |

*Primary Examiner* — Bitew A Dinke
(74) *Attorney, Agent, or Firm* — Slater Matsil, LLP

(57) ABSTRACT

An embodiment is an apparatus. The apparatus includes: a collective wafer platter including a plurality of individual wafer pockets, the individual wafer pockets having respective individual wafer platters, the individual wafer platters configured to rotate around respective first axes, the collective wafer platter configured to rotate around a second axis; a motor coupled to the collective wafer platter; and a control unit configured to control the motor such that the individual wafer platters rotate around the respective first axes, and the collective wafer platter rotates around the second axis.

20 Claims, 23 Drawing Sheets

(56) References Cited

U.S. PATENT DOCUMENTS

| | | | |
|---|---|---|---|
| 2007/0122323 A1* | 5/2007 | Yamada | C23C 16/45587 422/243 |
| 2007/0286963 A1* | 12/2007 | Rocha-Alvarez | B05D 3/0209 427/508 |
| 2009/0117272 A1* | 5/2009 | Behres | C23C 16/301 427/255.5 |
| 2011/0031214 A1* | 2/2011 | Kim | C23C 16/4412 216/59 |
| 2011/0083602 A1* | 4/2011 | Bergmann | C23C 16/4584 117/107 |
| 2011/0300297 A1* | 12/2011 | Celaru | C23C 16/4584 427/255.5 |
| 2012/0288615 A1* | 11/2012 | Jung | C23C 16/45572 427/9 |
| 2013/0084391 A1* | 4/2013 | Lee | H01L 21/68764 427/255.5 |
| 2015/0243490 A1* | 8/2015 | Ryu | H01J 37/32899 216/67 |
| 2015/0275371 A1* | 10/2015 | Mizuta | C30B 25/02 438/478 |
| 2017/0092531 A1* | 3/2017 | Coomer | H01L 21/68742 |

* cited by examiner

SEMICONDUCTOR DEVICE AND MULTI-WAFER DEPOSITION APPARATUS

PRIORITY CLAIM AND CROSS-REFERENCE

This application claims the benefit of U.S. Provisional Application No. 62/434,864, filed on Dec. 15, 2016, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
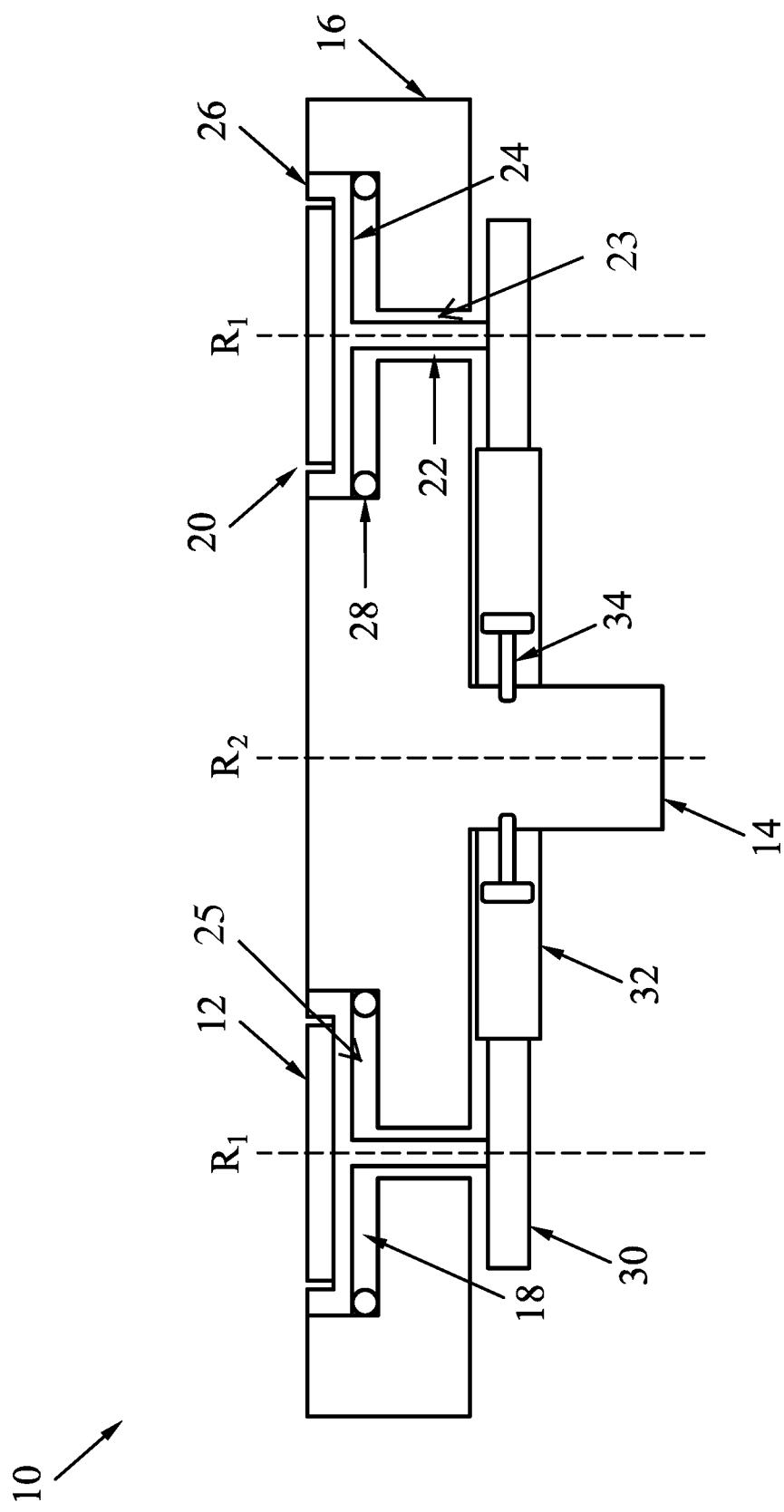
FIGS. 1A and 1B illustrate cross-sectional and planar views, respectively, of a collective wafer platter, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices, methods, and tools of manufacture are described in accordance with various embodiments. In particular, the tool of manufacture such as a deposition chamber may include a susceptor or wafer platform that heats a substrate during a deposition process. The susceptor includes several pockets for holding wafers, and each pocket has a gear mechanically coupled to a center gear of the susceptor. By rotating one of the center gear or the pocket gears, each of the wafers may be rotated in its respective pocket during deposition without breaking any vacuum of the deposition chamber (e.g., in situ). The susceptor may also be rotated during deposition. The top surface of the susceptor may have a non-uniform heating profile; rotating each of the wafers individually in their pocket and collectively with the susceptor may allow each wafer to be substantially uniformly heated during deposition. Uniformly heating the wafers during a deposition process may improve the uniformity of the thickness of the deposited material. Rotating without breaking any vacuum of the chamber during deposition may avoid tooling downtime that may be incurred by stopping the deposition process, removing and rotating the wafers, and restarting the deposition process.

Figure 1B:
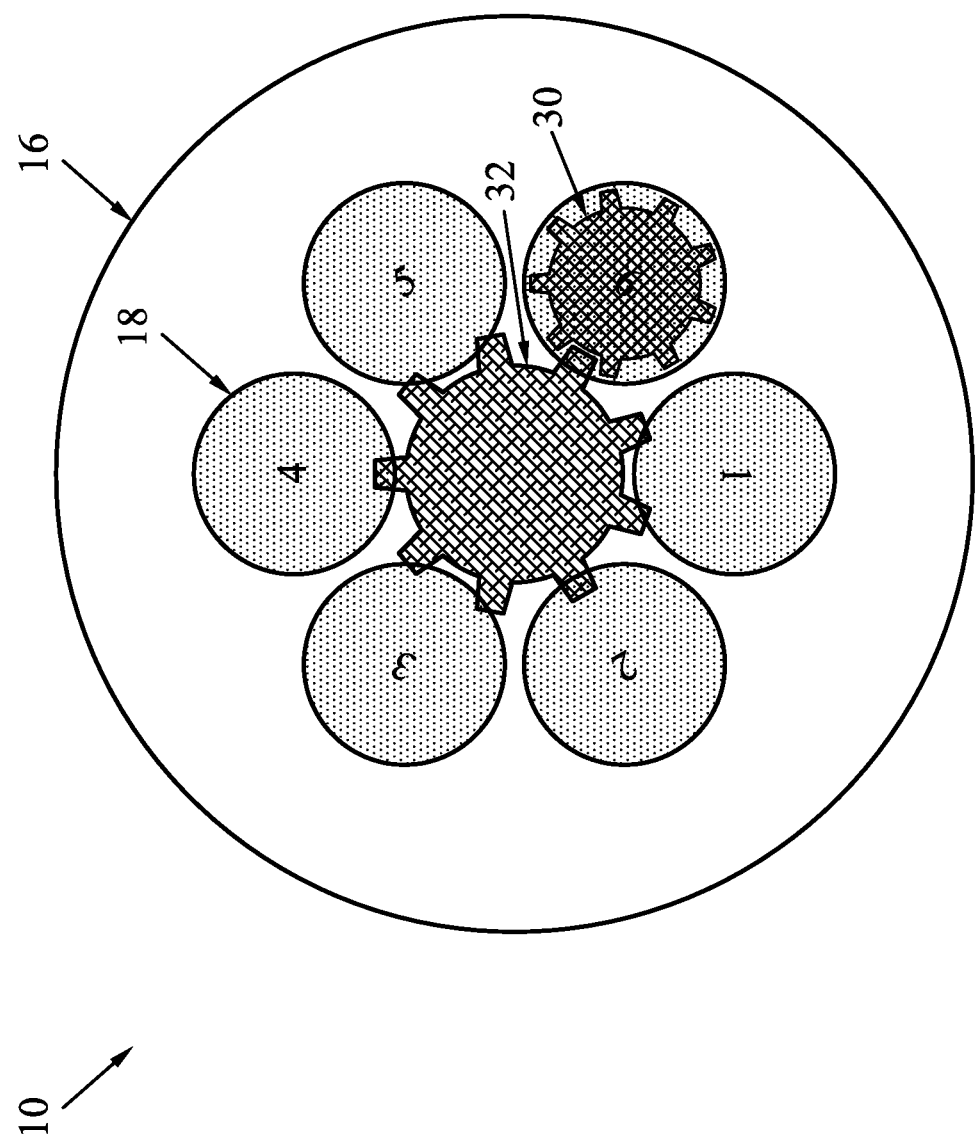

FIGS. 1A and 1B illustrate cross-sectional and planar views, respectively, of a collective wafer platter 10 for holding a plurality of wafers 12. The collective wafer platter 10 includes a shaft 14 and a susceptor 16. The collective wafer platter 10 may be connected to a drive mechanism (not shown in FIGS. 1A and 1B, but discussed below) that is operable to rotate or spin the susceptor 16 within a processing chamber during a wafer processing step, such as a deposition process. In some embodiments, the susceptor 16 is fixed to the shaft 14, and the drive mechanism drives the shaft 14 such that the shaft 14 and the susceptor 16 rotate together. In some embodiments, the susceptor 16 is free to rotate about the shaft 14, and the drive mechanism drives the susceptor 16 such that it rotates about the shaft 14. The susceptor 16 acts as a processing surface that, in some aspects, mechanically supports the wafers 12. The susceptor 16 may absorb electromagnetic energy and convert it to thermal energy that heats the wafers 12 during processing, and may be made of non-transparent materials such as silicon carbide, graphite with a silicon carbide coating, and/or the like. The susceptor 16 has a plurality of wafer pockets 18 that each hold respective wafers 12.

Individual wafer platters 20 hold the wafers 12 in respective wafer pockets 18. Each of the individual wafer platters 20 includes a mount 22 supporting a chuck 24. The chuck 24 has a radius measured from the center of the chuck 24 to an outer sidewall of the chuck 24. The mounts 22 are contained in holes 23 that extend through the susceptor 16 to a bottom surface of the susceptor 16, and the chucks 24 hold the wafers 12 in their respective wafer pockets 18. As illustrated in FIG. 1A, the wafer pockets 18 may have flat and unbroken bottom surfaces between the holes 23 and outer sidewalls of the wafer pockets 18. The individual wafer platters 20 further include isolators 26 that protect the wafers 12 and isolate them from one another. The isolators 26 extend along sidewalls of the wafers 12, and a top surface of the isolators 26 may (or may not) extend above a top surface of the wafers 12. The individual wafer platters 20 have a diameter equal to or larger than the diameter of the wafers 12 by nature of having the isolators 26. The wafer pockets 18 are equal to or larger than the wafers 12, and are large enough to accommodate the diameter of the individual wafer platters 20. Seals 28 are between the collective wafer platter 10 and the individual wafer platters 20, and prevent processing gasses (discussed further below) from escaping from the bottom of the wafer pockets 18 when the individual wafer platters 20 rotate. As illustrated in FIG. 1A, the wafer pockets 18 have spaces 25 bounded by the seals 28, the mounts 22, bottom surfaces of the individual wafer platters 20, and top surfaces of the collective wafer platter 10. The spaces 25 have a radius measured from the seals 28 to the mounts 22 that are greater than half the radius of the chuck 24. FIG. 1A also illustrates that the spaces 25 have heights measured between bottom surfaces of the individual wafer platters 20 and top surfaces of the collective wafer platter 10 equal to the heights of the seals 28. FIG. 1A further illustrates that the spaces 25 open on the holes 23 containing the mounts 22.

Each of the individual wafer platters 20 rotates the respective wafer 12 in the respective wafer pockets 18. The individual wafer platters 20 each have an individual susceptor gear 30 connected to the mount 22 on an opposite side of the susceptor 16 as the chuck 24. Although a single susceptor gear 30 is shown in FIG. 1B, it should be appreciated that each of the individual wafer platters 20 are coupled to a respective individual susceptor gear 30. Each individual susceptor gear 30 is physically and mechanically coupled to a collective susceptor gear 32. The collective susceptor gear 32 is mounted to the shaft 14 with fasteners 34, which may be, e.g., pins. During operation, the wafers 12 rotate individually in their wafer pockets 18 and collectively about the shaft 14. The individual wafer platters 20 rotate around first axes $R_1$ extending in longitudinal directions along the mounts 22, perpendicular to major surfaces of the individual susceptor gears 30. The collective wafer platter 10 rotates around a second axis $R_2$ extending in a longitudinal direction along the shaft 14, perpendicular to a major surface of the collective susceptor gear 32.

In some embodiments, the collective susceptor gear 32 rotates around the shaft when the shaft 14 rotates. In such embodiments, the susceptor 16 is fixed to the shaft 14, and the fasteners 34 attach the collective susceptor gear 32 to the shaft 14 such that the collective susceptor gear 32 rotates freely around the shaft 14. The drive mechanism is connected to and separately rotates the shaft 14 and the collective susceptor gear 32, and may rotate them in a different direction or a same direction. Rotating the collective susceptor gear 32 in a first direction turns the individual susceptor gears 30 in a second direction opposite the first direction, causing the mount 22, the chuck 24, and the isolators 26 for each of the individual wafer platters 20 to rotate, which in turn rotates the respective wafers 12. The individual wafer platters 20 rotate in a first rotational direction about the first axes $R_1$, and the collective wafer platter 10 rotates in a second rotational direction around the second axis $R_2$. In some embodiments, the first rotational direction and the second rotational direction are the same direction. For example, the collective wafer platter 10 and the individual wafer platters 20 may both rotate in a clockwise or counter-clockwise direction. In some embodiments, the first rotational direction is opposite the second rotational direction. For example, the collective wafer platter 10 may rotate in a clockwise direction and the individual wafer platters 20 may rotate in a counter-clockwise direction.

In some embodiments, the collective susceptor gear 32 is fixed to the shaft 14. In such embodiments, the susceptor 16 is free to rotate about the shaft 14, and the fasteners 34 attach the collective susceptor gear 32 to the shaft 14 such that the collective susceptor gear 32 does not rotate freely around the shaft 14. The drive mechanism is connected to and rotates one or more of the individual susceptor gears 30. Driving the individual susceptor gears 30 causes the individual wafer platters 20 to rotate, and also causes the individual susceptor gears 30 to rotate around the collective susceptor gear 32, thereby causing the susceptor 16 to rotate around the shaft 14.

Figure 2:
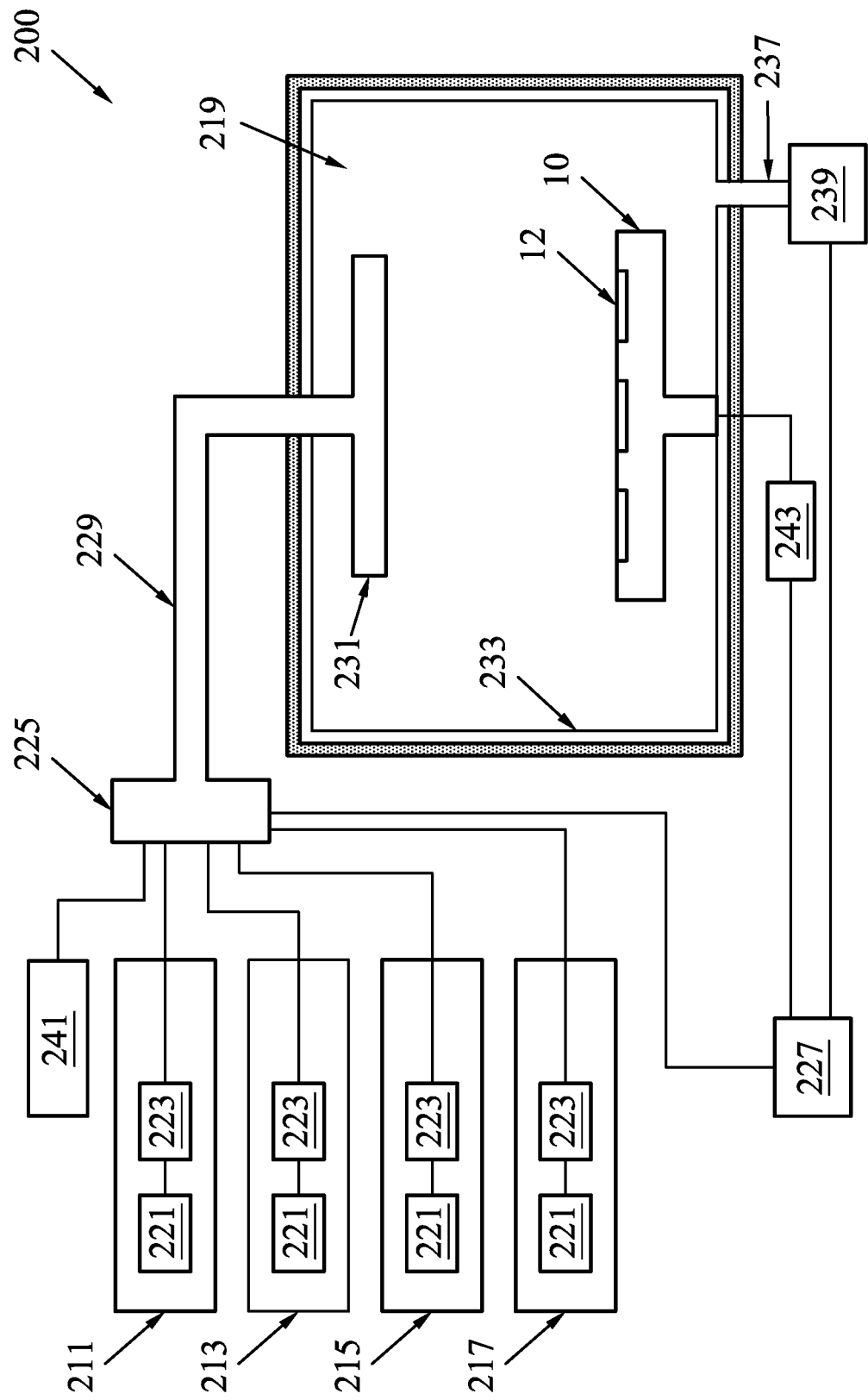
FIGS. 2 and 3 illustrate aspects of a deposition system, in accordance with some embodiments.
Figure 3:
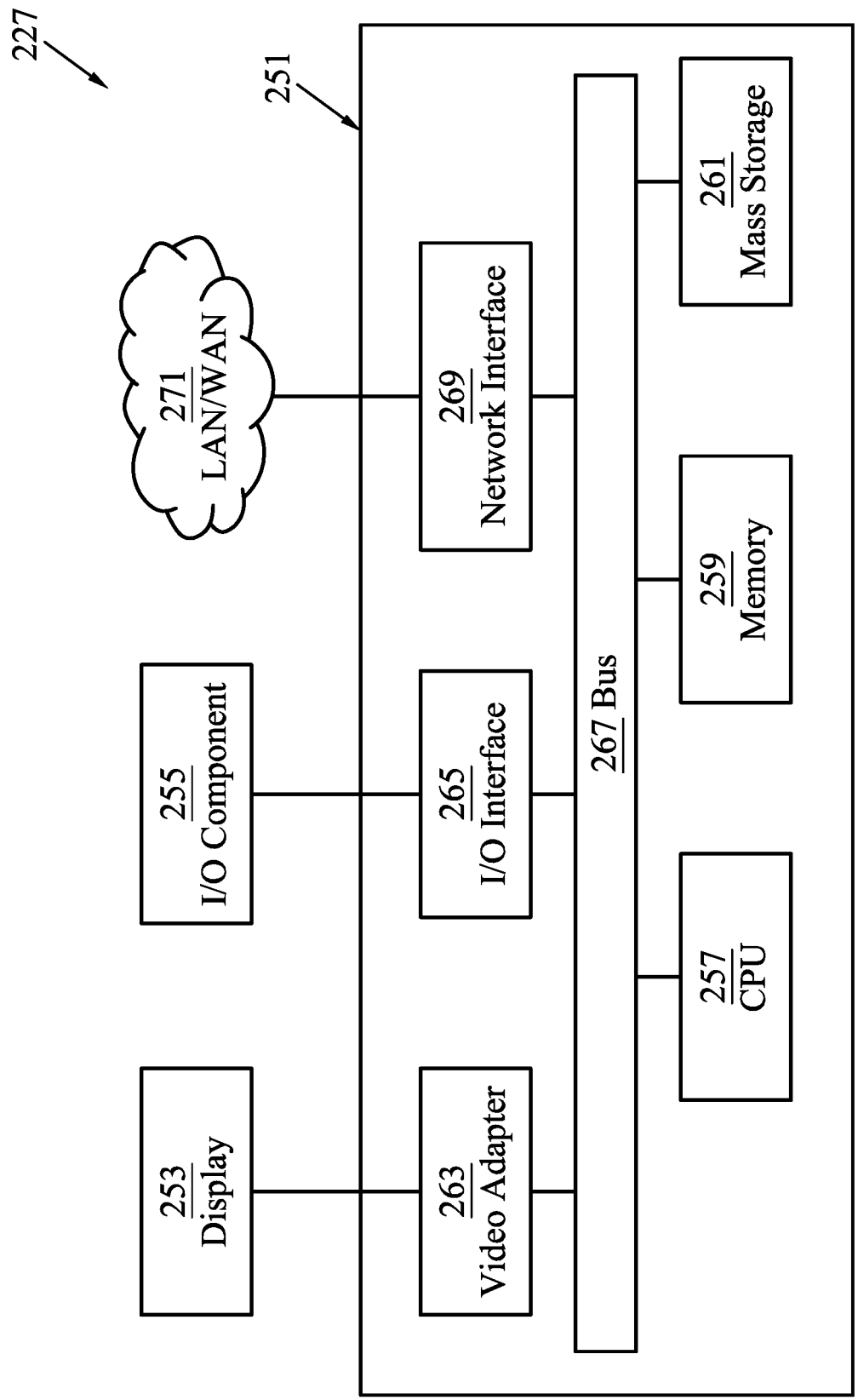

FIGS. 2 and 3 illustrate aspects of a deposition system 200 including the collective wafer platter 10. FIG. 2 illustrates a deposition system 200 that may be used to perform a conformal deposition process such as atomic layer deposition (ALD) to form one or more materials on the wafers 12. In an embodiment the deposition system 200 receives precursor materials from a first precursor delivery system 211, a second precursor delivery system 213, a third precursor delivery system 215, and a fourth precursor delivery system 217 to form a series of monolayers of materials to cover one or more features formed on the wafers 12. In an embodiment the first precursor delivery system 211, the second precursor delivery system 213, the third precursor delivery system 215, and the fourth precursor delivery system 217 may work in conjunction with one another to supply the various different precursor materials to a deposition chamber 219 wherein the wafers 12 are placed on the collective wafer platter 10. The first precursor delivery system 211, the second precursor delivery system 213 the third precursor delivery system 215, and the fourth precursor delivery system 217 may have physical components that are similar with each other.

For example, the first precursor delivery system 211, the second precursor delivery system 213, the third precursor delivery system 215, and the fourth precursor delivery system 217 may each include a gas supply 221 and a flow controller 223. In an embodiment in which the first precursor is stored in a gaseous state, the gas supply 221 may supply the first precursor to the deposition chamber 219. The gas supply 221 may be a vessel, such as a gas storage tank, that is located either locally to the deposition chamber 219 or else may be located remotely from the deposition chamber 219. Alternatively, the gas supply 221 may be a facility that independently prepares and delivers the first precursor to the flow controller 223. Any suitable source for the first precursor may be utilized as the gas supply 221, and all such sources are fully intended to be included within the scope of the embodiments.

The gas supply 221 may supply the desired precursor to the flow controller 223. The flow controller 223 may be utilized to control the flow of the precursor to a precursor gas controller 225 and, eventually, to the deposition chamber 219, thereby also helping to control the pressure within the deposition chamber 219. The flow controller 223 may be, e.g., a proportional valve, a modulating valve, a needle valve, a pressure regulator, a mass flow controller, combinations of these, or the like. However, any suitable method for controlling and regulating the flow may be utilized, and all such components and methods are fully intended to be included within the scope of the embodiments.

Although the first precursor delivery system 211, the second precursor delivery system 213, the third precursor delivery system 215, and the fourth precursor delivery system 217 have been described herein as having identical components, as one of ordinary skill in the art will recognize, this is merely an illustrative example and is not intended to limit the embodiments in any fashion. Any type of suitable precursor delivery system, with any type and number of individual components identical to or different from any of the other precursor delivery systems within the deposition system 200, may alternatively be utilized. All such precursor systems are fully intended to be included within the scope of the embodiments.

Additionally, in an embodiment in which the first precursor is stored in a solid or liquid state, the gas supply 221 may store a carrier gas and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to a precursor gas controller 225. Any suitable method and combination of units may be utilized to provide the first precursor, and all such combination of units are fully intended to be included within the scope of the embodiments.

The first precursor delivery system 211, the second precursor delivery system 213, the third precursor delivery system 215 and the fourth precursor delivery system 217 may supply their individual precursor materials into the precursor gas controller 225. The precursor gas controller 225 connects and isolates the first precursor delivery system 211, the second precursor delivery system 213, the third precursor delivery system 215, and the fourth precursor delivery system 217 to and from the deposition chamber 219 in order to deliver the desired precursor materials to the deposition chamber 219. The precursor gas controller 225 may include such devices as valves, flow meters, sensors, and the like to control the delivery rates of each of the precursors, and may be controlled by instructions received from a control unit 227 (described further below with respect to FIG. 3).

The precursor gas controller 225, upon receiving instructions from the control unit 227, may open and close valves so as to connect one of the first precursor delivery system 211, the second precursor delivery system 213, the third precursor delivery system 215, and the fourth precursor delivery system 217 to the deposition chamber 219 and direct a desired precursor material through a manifold 229, into the deposition chamber 219, and to a showerhead 231. The showerhead 231 may be utilized to disperse the chosen precursor material into the deposition chamber 219 and may be designed to evenly disperse the precursor material in order to minimize undesired process conditions that may arise from uneven dispersal. In an embodiment the showerhead 231 may have a circular design with openings dispersed evenly around the showerhead 231 to allow for the dispersal of the desired precursor material into the deposition chamber 219.

However, as one of ordinary skill in the art will recognize, the introduction of precursor materials to the deposition chamber 219 through a single showerhead 231 or through a single point of introduction as described above is intended to be illustrative only and is not intended to be limiting to the embodiments. Any number of separate and independent showerheads 231 or other openings to introduce precursor materials into the deposition chamber 219 may alternatively be utilized. All such combinations of showerheads and other points of introduction are fully intended to be included within the scope of the embodiments.

The deposition chamber 219 may receive the desired precursor materials and expose the precursor materials to the wafers 12. The deposition chamber 219 may be any desired shape that may be suitable for dispersing the precursor materials and contacting the precursor materials with the wafers 12. In the embodiment illustrated in FIG. 2, the deposition chamber 219 has a cylindrical sidewall and a bottom. However, the deposition chamber 219 is not limited to a cylindrical shape, and any other suitable shape, such as a hollow square tube, an octagonal shape, or the like, may be utilized. Furthermore, the deposition chamber 219 may be surrounded by a housing 233 made of material that is inert to the various process materials. As such, while the housing 233 may be any suitable material that can withstand the chemistries and pressures involved in the deposition process, in an embodiment the housing 233 may be steel, stainless steel, nickel, aluminum, alloys of these, combinations of these, and like.

Within the deposition chamber 219 the wafers 12 may be placed on the collective wafer platter 10 in order to position and control the wafers 12 during the deposition processes, as well as to rotate the wafers 12. As noted above, the susceptor 16 of the collective wafer platter 10 may heat the wafers 12 during the deposition processes. The control unit 227 may control the heat produced by the susceptor 16. Furthermore, although a single collective wafer platter 10 is illustrated in FIG. 2, any number of collective wafer platter 10 may additionally be included within the deposition chamber 219. A drive mechanism 243 may be coupled to the shaft 14, the collective susceptor gear 32, and/or the individual susceptor gears 30. The drive mechanism 243 may be, e.g., motors, and are operable to rotate the wafers 12 collectively about the shaft 14 (e.g., by rotating the shaft 14) and individually in their wafer pockets 18 (e.g., by rotating the collective susceptor gear 32 around the shaft 14). In embodiments where the collective susceptor gear 32 freely rotates around the shaft 14, the drive mechanism 243 drives the shaft 14 and the collective susceptor gear 32. In embodiments where the collective susceptor gear 32 is fixed to the shaft 14, the drive mechanism 243 drives individual susceptor gears 30. The drive mechanism 243 may be controlled by the control unit 227 during the deposition processes.

Additionally, the deposition chamber 219 and the collective wafer platter 10 may be part of a cluster tool system (not shown). The cluster tool system may be used in conjunction with an automated handling system in order to position and place the wafers 12 into the deposition chamber 219 prior to the deposition processes, position, hold the wafers 12 during the deposition processes, and remove the wafers 12 from the deposition chamber 219 after the deposition processes.

The deposition chamber 219 may also have an exhaust outlet 237 for exhaust gases to exit the deposition chamber 219. A vacuum pump 239 may be connected to the exhaust outlet 237 of the deposition chamber 219 in order to help evacuate the exhaust gases. The vacuum pump 239, under control of the control unit 227, may also be utilized to reduce and control the pressure within the deposition chamber 219 to a desired pressure and may also be utilized to evacuate precursor materials from the deposition chamber 219 in preparation for the introduction of the next precursor material.

FIG. 3 illustrates an embodiment of the control unit 227 that may be utilized to control the precursor gas controller 225 and the vacuum pump 239 (as illustrated in FIG. 2). The control unit 227 may be any form of computer processor that can be used in an industrial setting for controlling process machines. In an embodiment, the control unit 227 comprises a processing unit 251, such as a desktop computer, a workstation, a laptop computer, or a dedicated unit customized for a particular application. The control unit 227 may be equipped with a display 253 and one or more input/output components 255, such as instruction outputs, sensor inputs, a mouse, a keyboard, printer, combinations of these, or the like. The processing unit 251 may include a central processing unit (CPU) 257, memory 259, a mass storage device 261, a video adapter 263, and an I/O interface 265 connected to a bus 267.

The bus 267 may be one or more of any type of several bus architectures including a memory bus or memory controller, a peripheral bus, or video bus. The CPU 257 may comprise any type of electronic data processor, and the memory 259 may comprise any type of system memory, such as static random access memory (SRAM), dynamic random access memory (DRAM), or read-only memory (ROM). The mass storage device 261 may comprise any type of storage device configured to store data, programs, and other information and to make the data, programs, and other information accessible via the bus 267. The mass storage device 261 may comprise, for example, one or more of a hard disk drive, a magnetic disk drive, or an optical disk drive.

The video adapter 263 and the I/O interface 265 provide interfaces to couple external input and output devices to the processing unit 251. As illustrated in FIG. 3, examples of input and output devices include the display 253 coupled to the video adapter 263 and the I/O component 255, such as a mouse, keyboard, printer, and the like, coupled to the I/O interface 265. Other devices may be coupled to the processing unit 251, and additional or fewer interface cards may be utilized. For example, a serial interface card (not shown) may be used to provide a serial interface for a printer. The processing unit 251 also may include a network interface 269 that may be a wired link to a local area network (LAN) or a wide area network (WAN) 271 and/or a wireless link.

It should be noted that the control unit 227 may include other components. For example, the control unit 227 may include power supplies, cables, a motherboard, removable storage media, cases, and the like. These other components, although not shown in FIG. 3, are considered part of the control unit 227.

The collective wafer platter 10 and the deposition chamber 200 described above in FIGS. 1A through 3 may be used to perform various steps in the manufacturing of FinFETs (or other integrated circuits) on the wafers 12. As noted above, the deposition chamber 200 may be used to perform a conformal deposition process such as ALD. As such, the deposition chamber 200 may be used to perform ALD processes used in the manufacturing FinFETs on the wafers 12. After manufacture of the integrated circuits on the wafers 12, the wafers 12 may be singulated to form individual integrated circuit devices.

Figure 4:
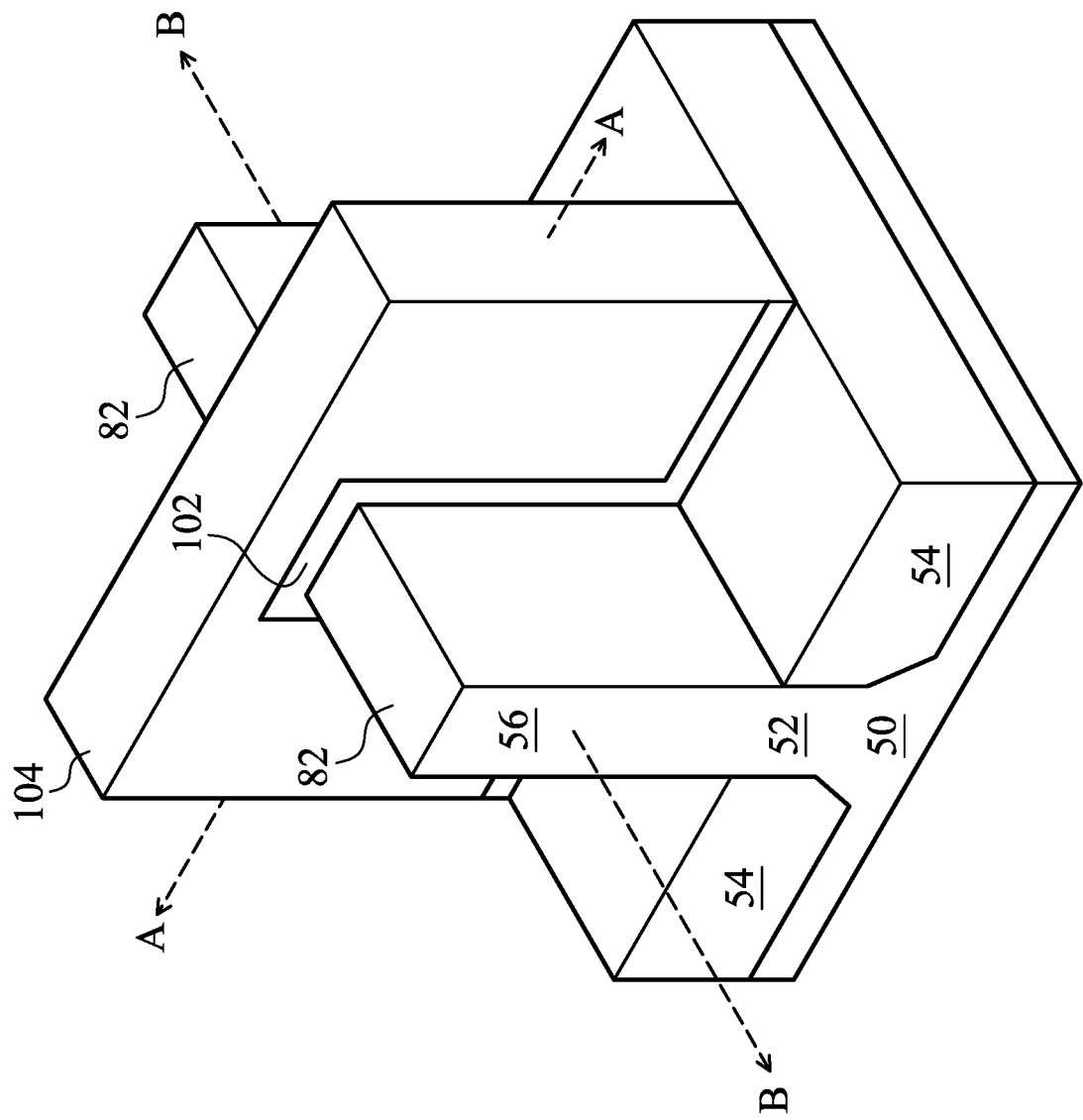
FIG. 4 illustrates an example of a FinFET in a three-dimensional view, in accordance with some embodiments.

FIG. 4 illustrates an example of a FinFET in a three-dimensional view. The FinFET comprises a fin 56 on a substrate 50. The substrate 50 includes isolation regions 54, and the fin 56 protrudes above and from between neighboring isolation regions 54. A gate dielectric 92 is along sidewalls and over a top surface of the fin 56, and a gate electrode 94 is over the gate dielectric 92. Source/drain regions 82 are disposed in opposite sides of the fin 56 with respect to the gate dielectric 92 and gate electrode 94. FIG. 1 further illustrates reference cross-sections that are used in later figures. Cross-section A-A is across a channel, gate dielectric 92, and gate electrode 94 of the FinFET. Cross-section B-B is perpendicular to cross-section A-A and is along a longitudinal axis of the fin 56 and in a direction of, for example, a current flow between the source/drain regions 82. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 5 through 22B are cross-sectional views of intermediate stages in the manufacturing of FinFETs on the wafers 12 in accordance with exemplary embodiments. FIGS. 5 through 9 illustrate reference cross-section A-A illustrated in FIG. 4, except for multiple FinFETs. FIGS. 10A through 22B, figures ending with an "A" designation are illustrated along reference cross-section A-A illustrated in FIG. 4, and figures ending with a "B" designation are illustrated along a similar cross-section B-B, except for multiple FinFETs.

Figure 5:
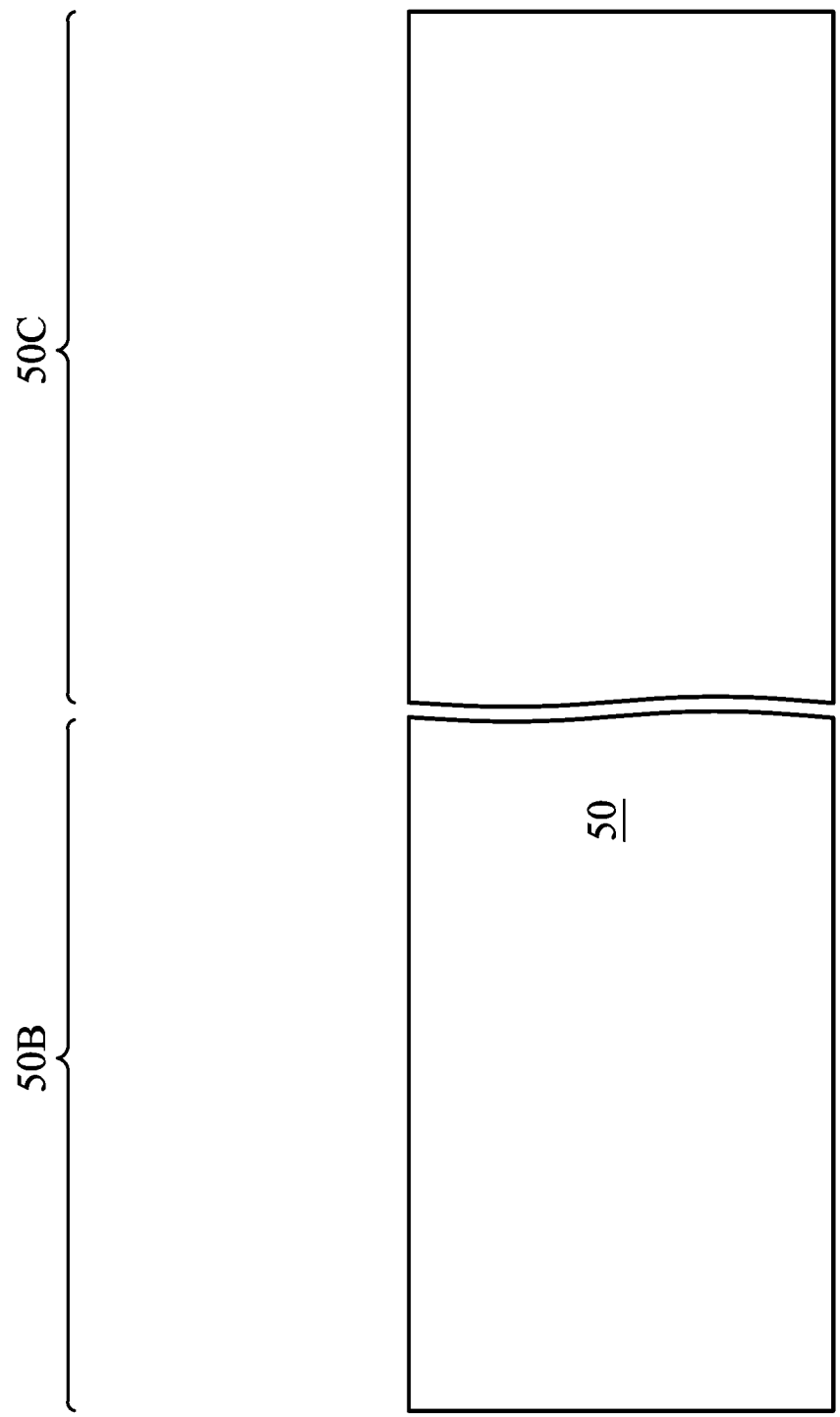
FIGS. 5 through 22B are cross-sectional views of intermediate stages in the manufacturing of FinFETs utilizing the deposition system of FIGS. 2 and 3, in accordance with some embodiments.

In FIG. 5, a substrate 50 is provided to form the wafers 12. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 50 may be The substrate 50 has a first region 50B and a second region 50C. The first region 50B can be for forming n-type devices, such as NMOS transistors, e.g., n-type FinFETs. The second region 50C can be for forming p-type devices, such as PMOS transistors, e.g., p-type FinFETs. In some embodiments, both the first region 50B and the second region 50C are used to form the same type of devices, such as both regions being for n-type devices or p-type devices.

Figure 6:
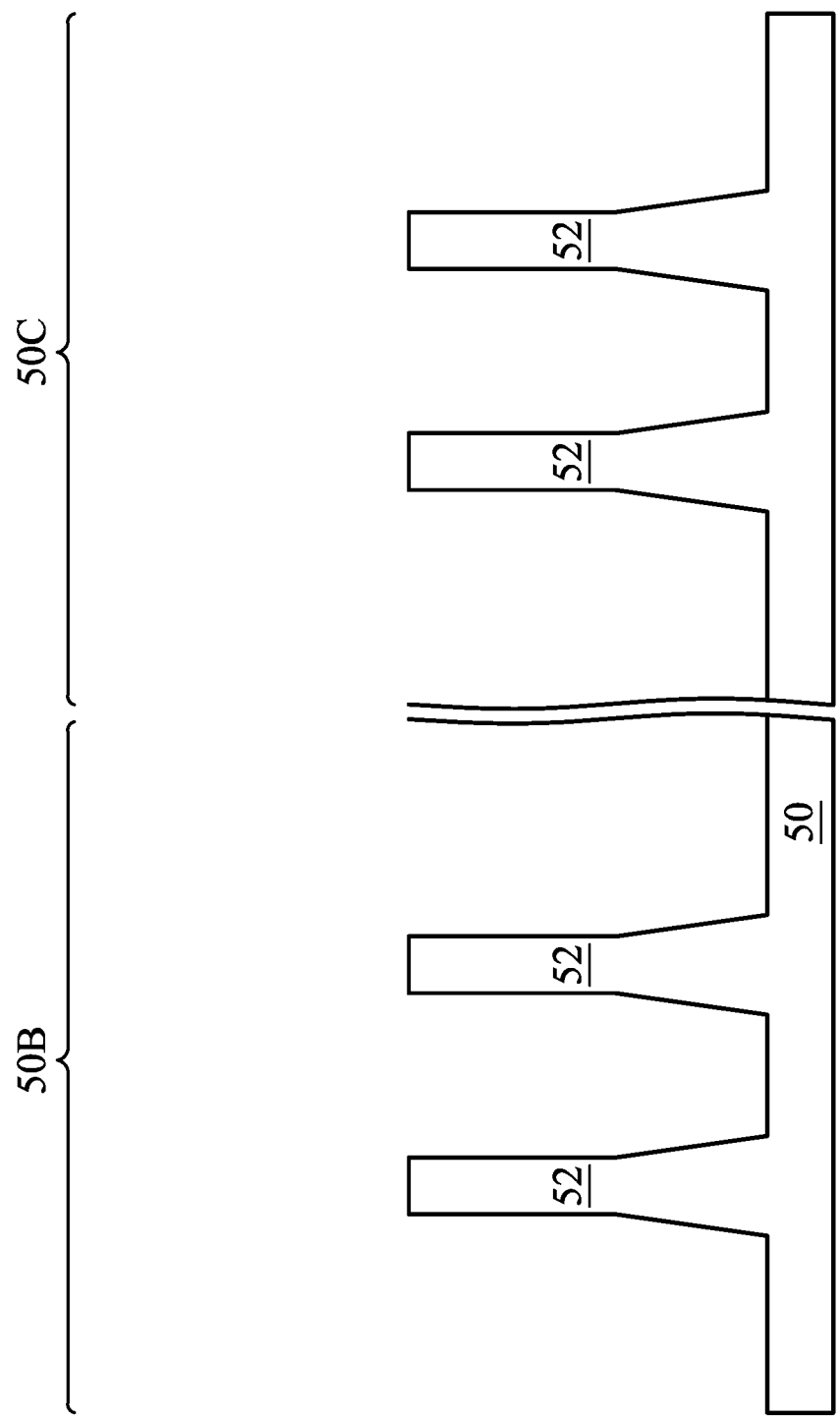

In FIG. 6, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Figure 7:
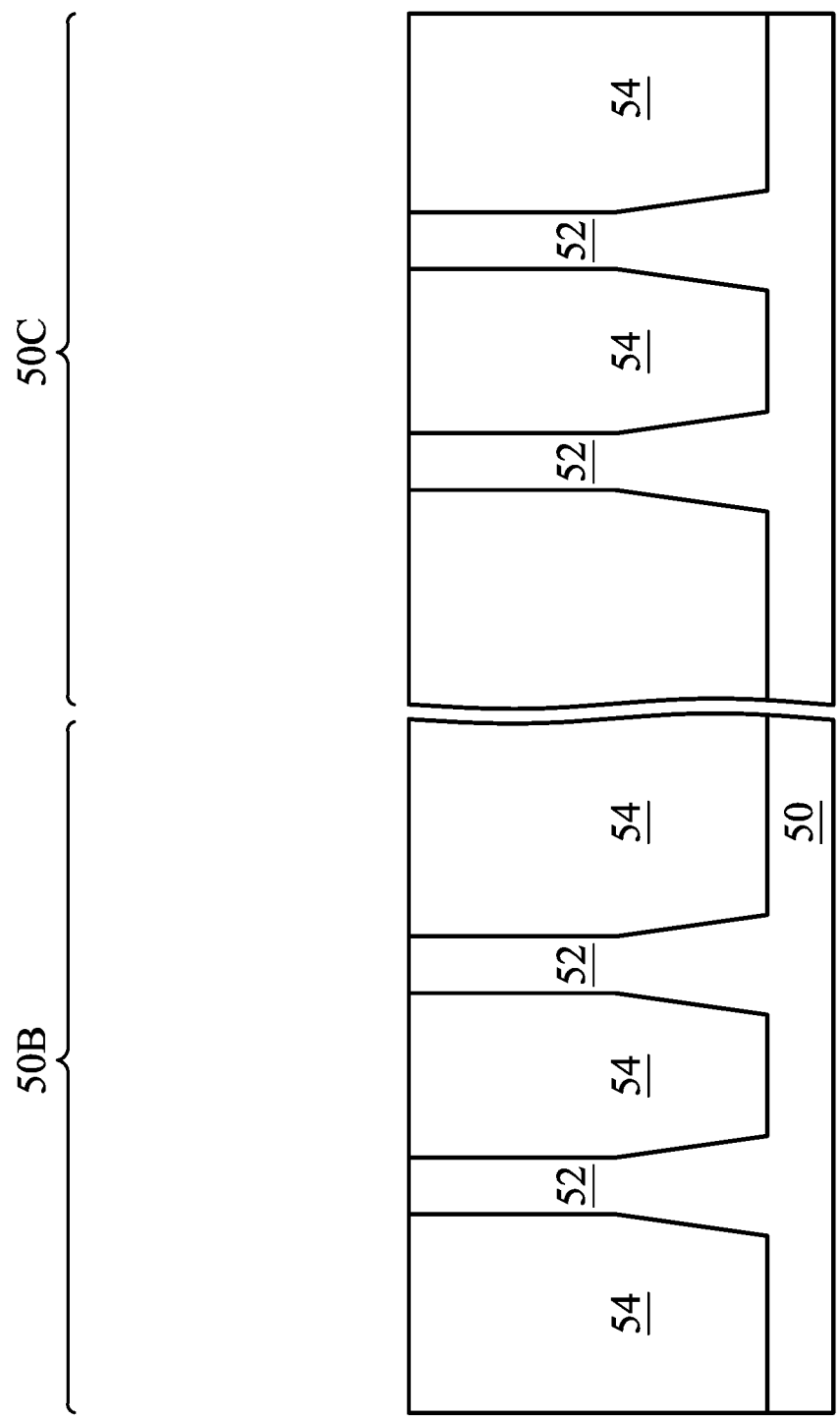

In FIG. 7, an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. The insulating material 54 may be referred to as isolation regions 54. Further in FIG. 7, a planarization process, such as a chemical mechanical polish (CMP), may remove any excess insulation material 54 and form top surfaces of the isolation regions 54 and top surfaces of the fins 52 that are level.

Figure 8:
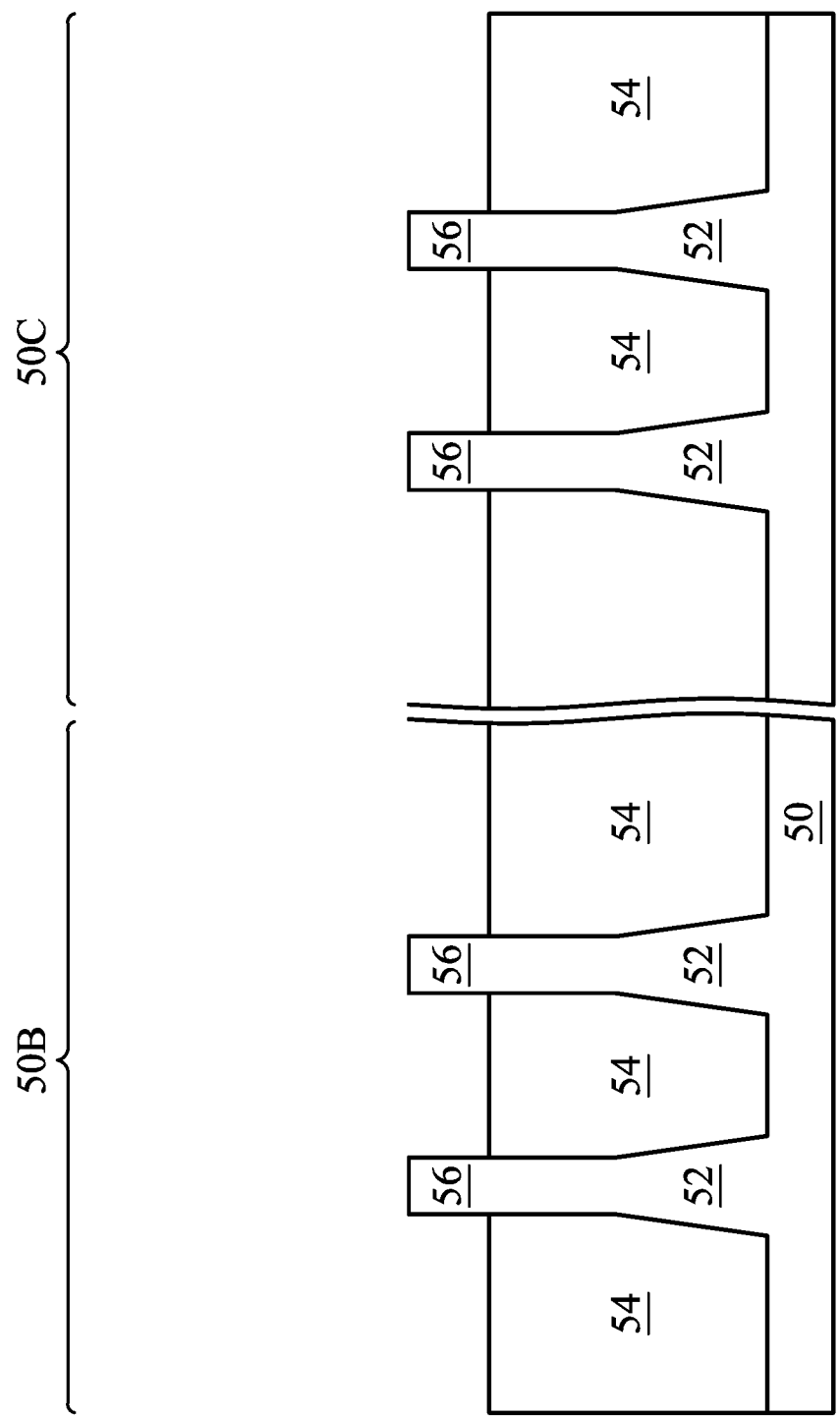

In FIG. 8, the isolation regions 54 are recessed to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 5 through 8 is just one example of how the fins 56 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 7 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may be formed from silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 8, appropriate wells (not shown) may be formed in the fins 56, the fins 52, and/or the substrate 50. In some embodiments, a P well may be formed in the first region 50B, and an N well may be formed in the second region 50C. In some embodiments, a P well or an N well are formed in both the first region 50B and the second region 50C.

In the embodiments with different well types, the different implant steps for the first region 50B and the second region 50C may be achieved using a photoresist or other masks (not shown). For example, a photoresist may be formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region 50C, such as the PMOS region. The p-type impurities may be boron, BF2, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the first region 50B and the second region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 9:
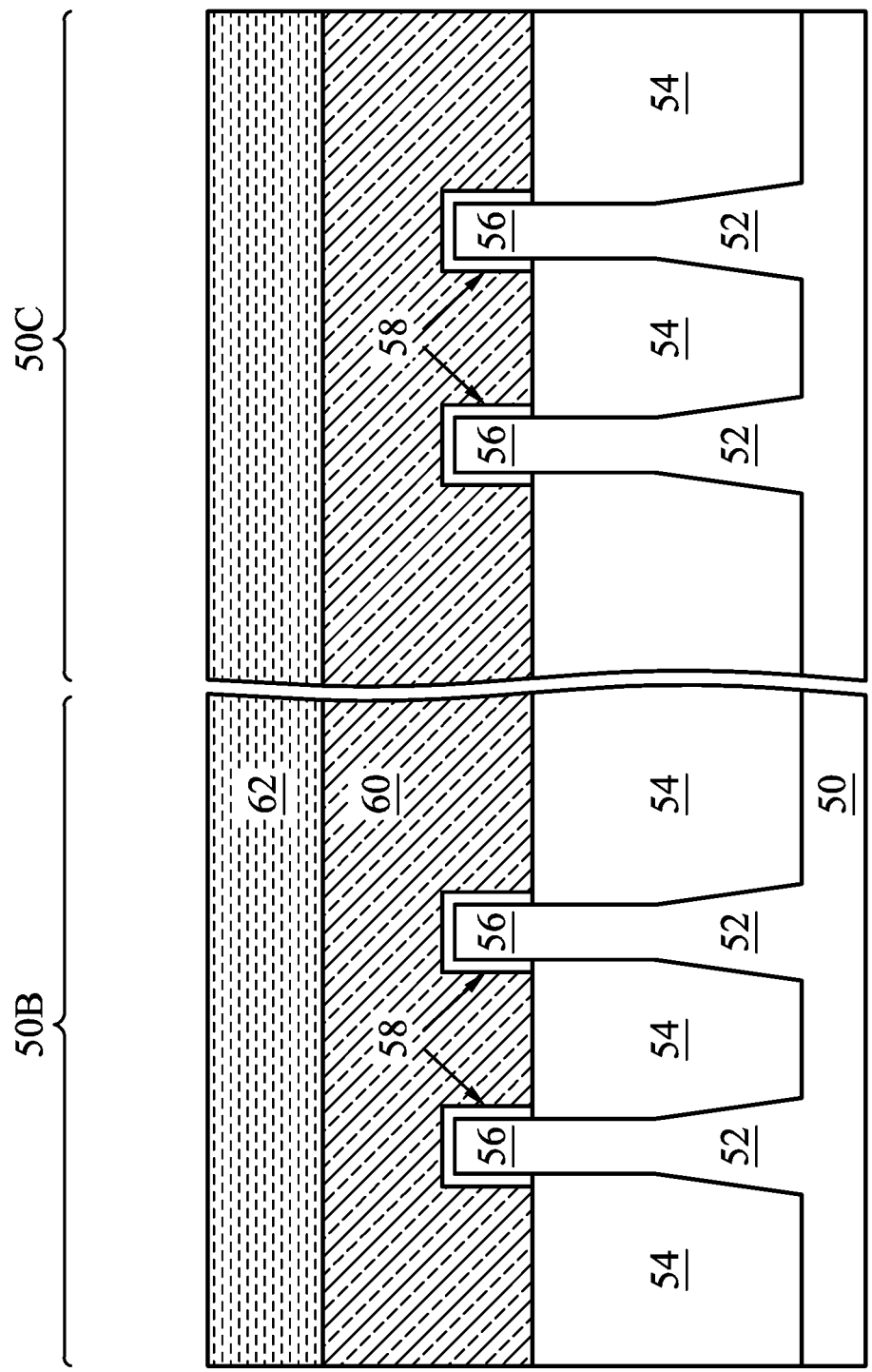

In FIG. 9, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 60 may be deposited by physical vapor deposition (PVD), CVD, sputter deposition, or other techniques known and used in the art for depositing conductive materials. The dummy gate layer 60 may be made of other materials that have a high etching selectivity from the etching of isolation regions. The mask layer 62 may include, for example, SiN, SiON, or the like. In this example, a single dummy gate layer 60 and a single mask layer 62 are formed across the first region 50B and the second region 50C. In some embodiments, separate dummy gate layers may be formed in the first region 50B and the second region 50C, and separate mask layers may be formed in the first region 50B and the second region 50C.

Figure 10B:
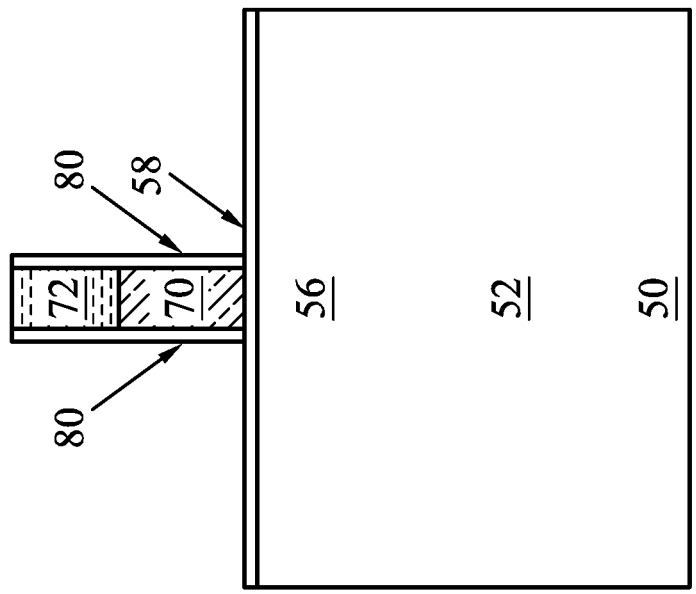
Figure 10A:
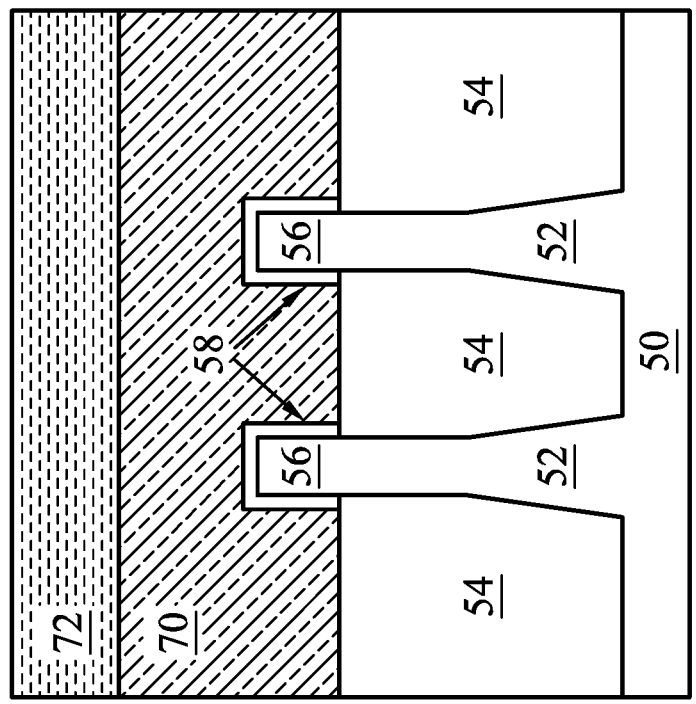

In FIGS. 10A and 10B, the mask layer 62 may be patterned using acceptable photolithography and etching techniques to form masks 72. The pattern of the masks 72 then may be transferred to the dummy gate layer 60 and the dummy dielectric layer 58 by an acceptable etching technique to form dummy gates 70. The dummy gates 70 cover respective channel regions of the fins 56. The dummy gates 70 may also have a lengthwise direction substantially perpendicular to the lengthwise direction of respective epitaxial fins.

Further in FIGS. 10A and 10B, gate seal spacers 80 can be formed on exposed surfaces of the dummy gates 70, the masks 72, and/or the fins 56. A thermal oxidation or a deposition followed by an anisotropic etch may form the gate seal spacers 80.

After the formation of the gate seal spacers 80, implants for lightly doped source/drain (LDD) regions may be performed. In the embodiments with different device types, similar to the implants discussed above in FIG. 8, a mask, such as a photoresist, may be formed over the first region 50B, while exposing the second region 50C, and appropriate type (e.g., n-type or p-type) impurities may be implanted into the exposed fins 56 in the second region 50C. The mask may then be removed. Subsequently, a mask, such as a photoresist, may be formed over the second region 50C while exposing the first region 50B, and appropriate type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 11B:
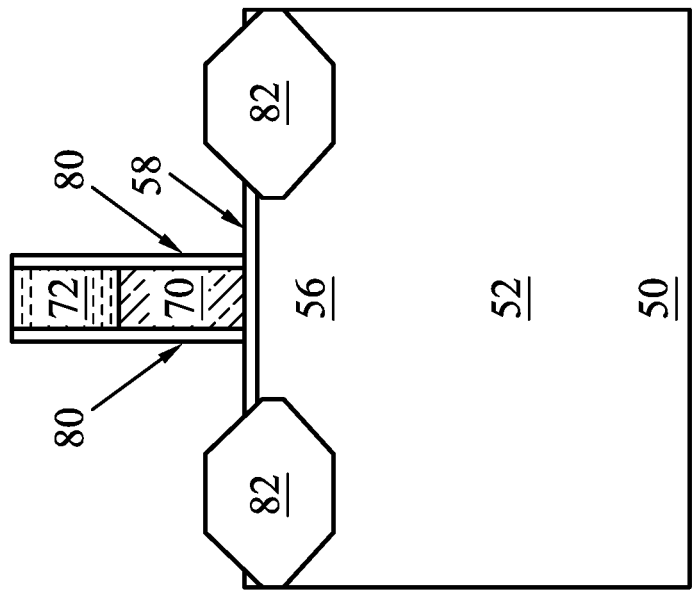
Figure 11A:
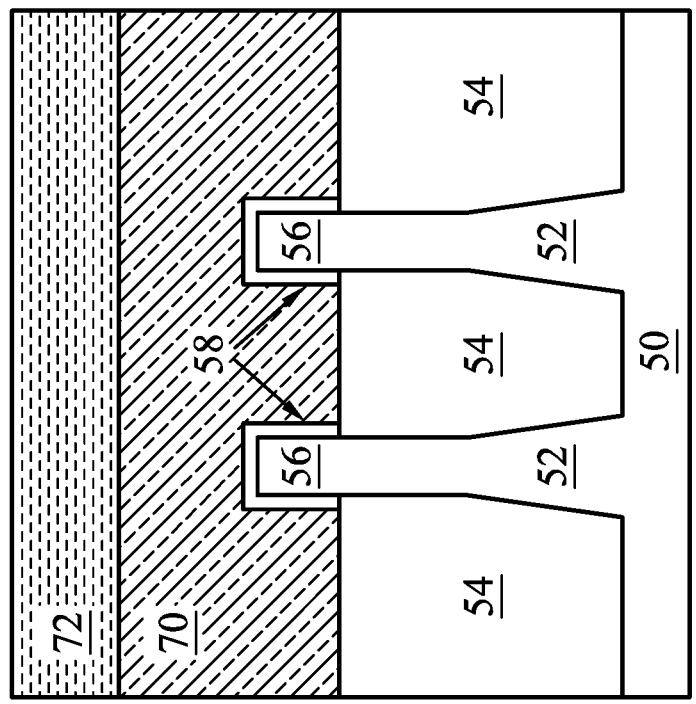

In FIGS. 11A and 11B epitaxial source/drain regions 82 are formed in the fins 56. The epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52.

The epitaxial source/drain regions 82 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. The epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. Subsequently, the dummy gate spacers in the first region 50B are removed, for example, by an etch, as is the mask on the second region 50C.

The epitaxial source/drain regions 82 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 70 and/or gate seal spacers 80 in the second region 50C. Then, source/drain regions of the epitaxial fins in the second region 50C are etched to form recesses. The epitaxial source/drain regions 82 in the second region 50C are epitaxially grown in the recesses. The epitaxial source/drain regions 82 may include any acceptable material, such as appropriate for p-type FinFETs. For example, if the fin 56 is silicon, the epitaxial source/drain regions 82 may comprise SiGe, SiGeB, Ge, GeSn, or the like. The epitaxial source/drain regions 82 may have surfaces raised from respective surfaces of the fins 56 and may have facets. Subsequently, the dummy gate spacers in the second region 50C are removed, for example, by an etch, as is the mask on the first region 50B.

Figure 12B:
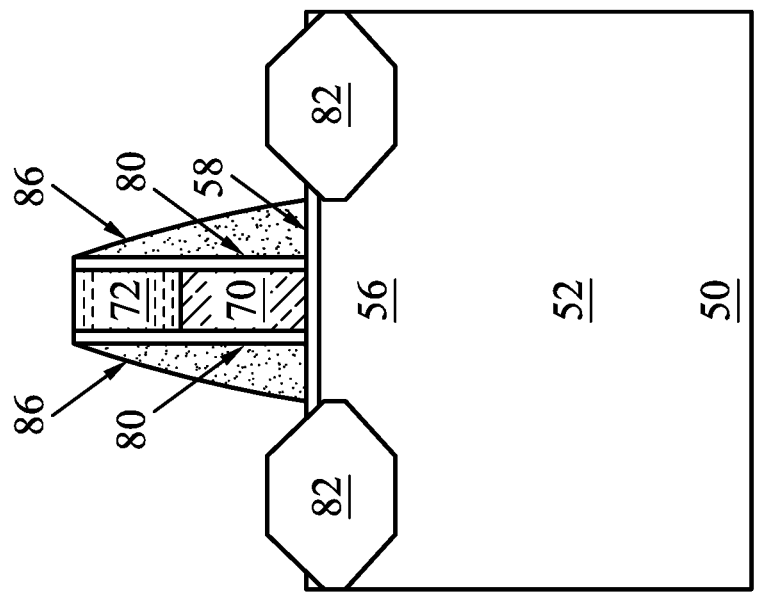
Figure 12A:
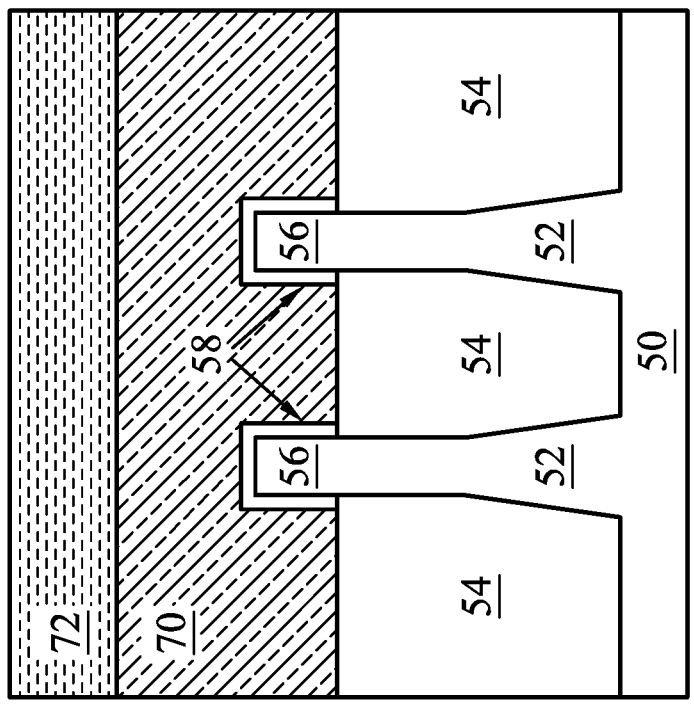

In FIGS. 12A and 12B, gate spacers 86 are formed on the gate seal spacers 80 along sidewalls of the dummy gates 70 and the masks 72. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and/or the epitaxial fins may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 13B:
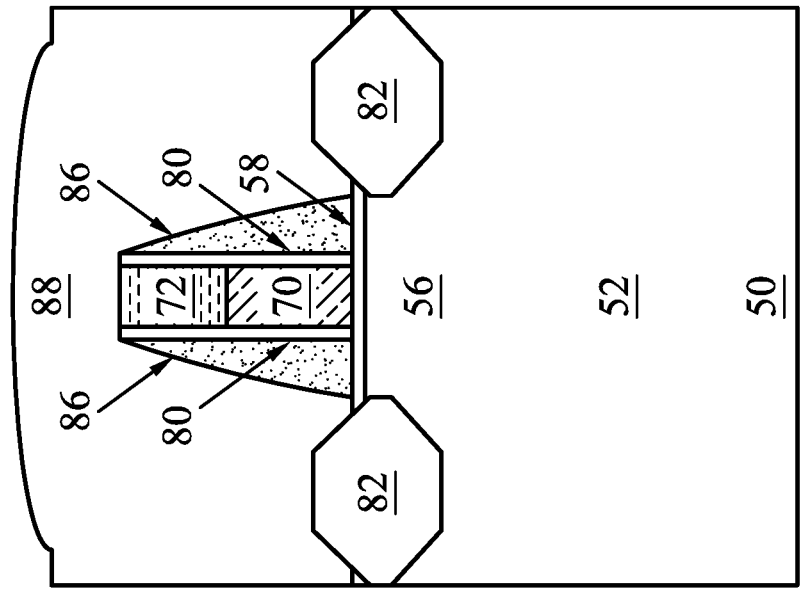
Figure 13A:
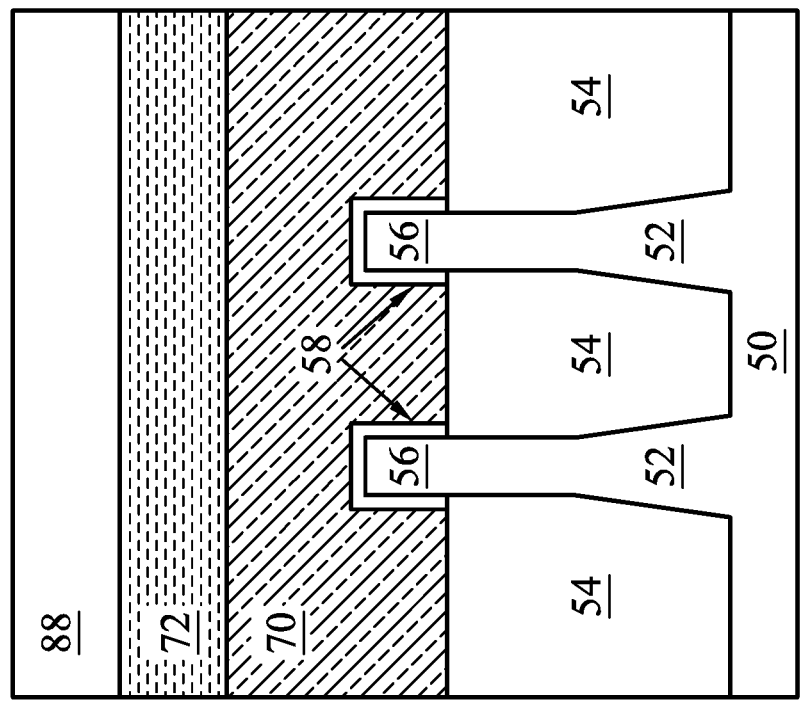

In FIGS. 13A and 13B, an ILD 88 is deposited over the structure illustrated in FIGS. 12A and 12B. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used.

Figure 14B:
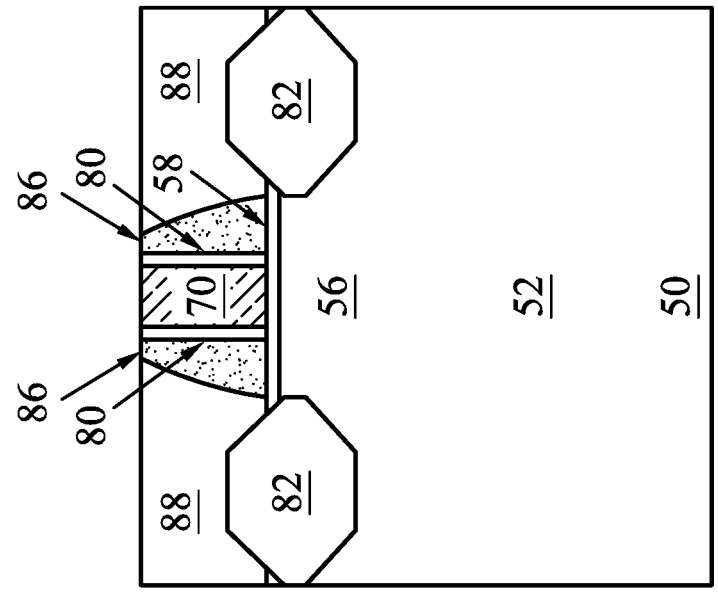
Figure 14A:
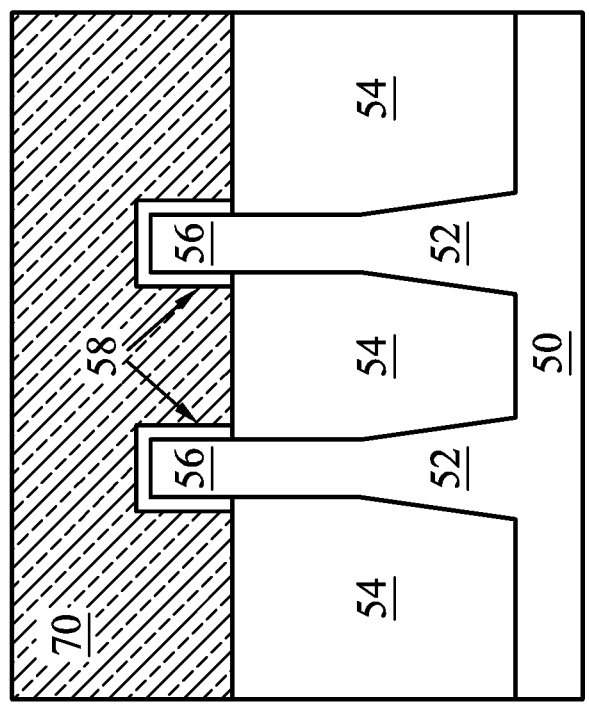

In FIGS. 14A and 14B, a planarization process, such as a CMP, may be performed to level the top surface of the ILD 88 with the top surfaces of the dummy gates 70. The planarization process may also remove the masks 72 on the dummy gates 70, and portions of the gate seal spacers 80 and the gate spacers 86 along sidewalls of the masks 72. After the planarization process, top surfaces of the dummy gates 70, the gate seal spacers 80, the gate spacers 86, and the ILD 88 are level. Accordingly, the top surfaces of the dummy gates 70 are exposed through the ILD 88.

Figure 15B:
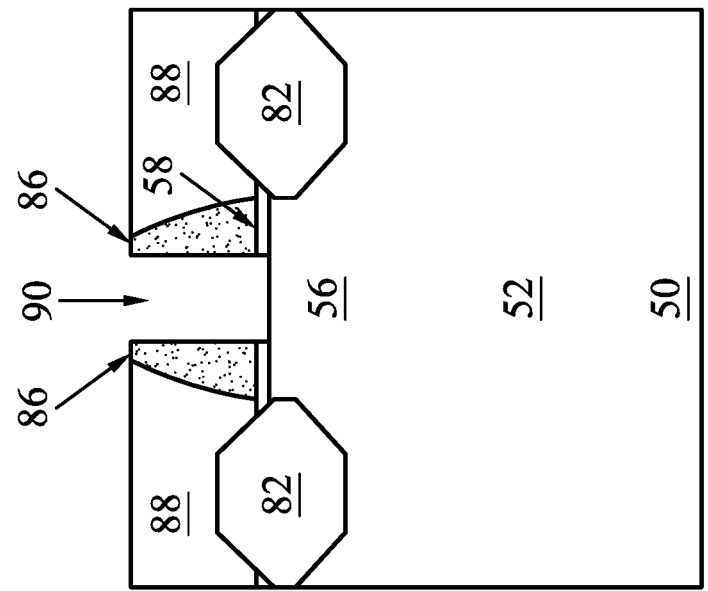
Figure 15A:
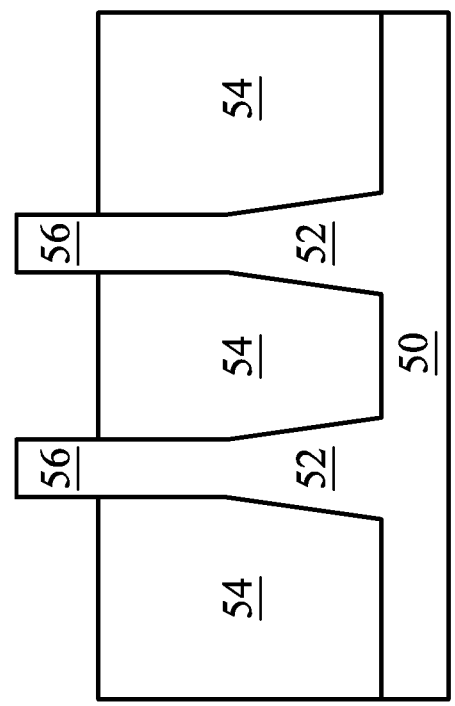

In FIGS. 15A and 15B, the exposed portions of the dummy gates 70, the gate seal spacers 80, and portions of the dummy dielectric layer 58 directly underlying the exposed dummy gates 70 are removed in an etching step(s), so that recesses 90 are formed. In some embodiments, the dummy gates 70 are removed by an anisotropic dry etch process. For example, the etching process may include a dry etch process using reaction gas(es) that selectively etch the dummy gates 70 without etching the ILD 88 or the gate spacers 86. Each recess 90 exposes a channel region of a respective fin. Each channel region is disposed between neighboring pairs of the epitaxial source/drain regions 82. During the removal, the dummy dielectric layer 58 may be used as an etch stop layer when the dummy gates 70 are etched. The dummy dielectric layer 58 and the gate seal spacers 80 may then be removed after the removal of the dummy gates 70.

Figure 16B:
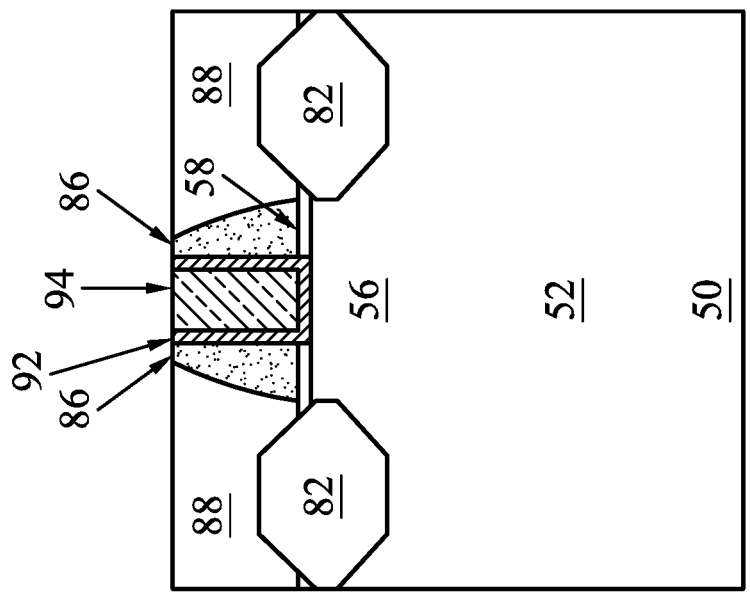
Figure 16A:
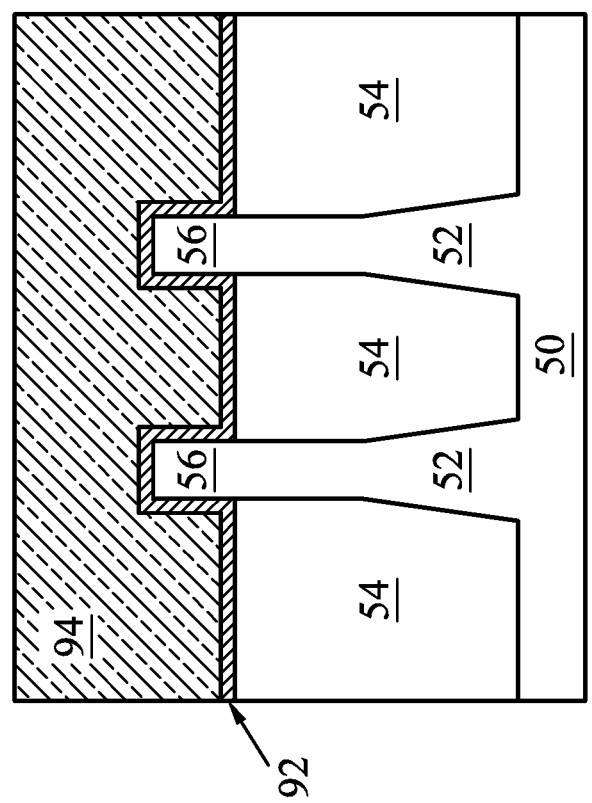

In FIGS. 16A and 16B, gate dielectric layers 92 and gate electrodes 94 are formed for replacement gates. Gate dielectric layers 92 are deposited conformally in the recesses 90, such as on the top surfaces and the sidewalls of the fins 56 and on sidewalls of the gate spacers 86, and on a top surface of the ILD 88. In accordance with some embodiments, the gate dielectric layers 92 are silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In some embodiments, the dielectric layers 92 are deposited with an ALD process using the deposition system 200.

The gate electrodes 94 are deposited over the gate dielectric layers 92, respectively, and fill the remaining portions of the recesses 90. The gate electrodes 94 may be a metal-containing material such as TiN, TaN, TaC, Co, Ru, Al, combinations thereof, or multi-layers thereof. After the filling of the gate electrodes 94, a planarization process, such as a CMP, may be performed to remove the excess portions of the gate dielectric layers 92 and the material of the gate electrodes 94, which excess portions are over the top surface of the ILD 88. The resulting remaining portions of material of the gate electrodes 94 and the gate dielectric layers 92 thus form replacement gates of the resulting FinFETs. The gate electrodes 94 and the gate dielectric layers 92 may be collectively referred to as a "gate" or a "gate stack."

The formation of the gate dielectric layers 92 in the first region 50B and the second region 50C may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 17A:
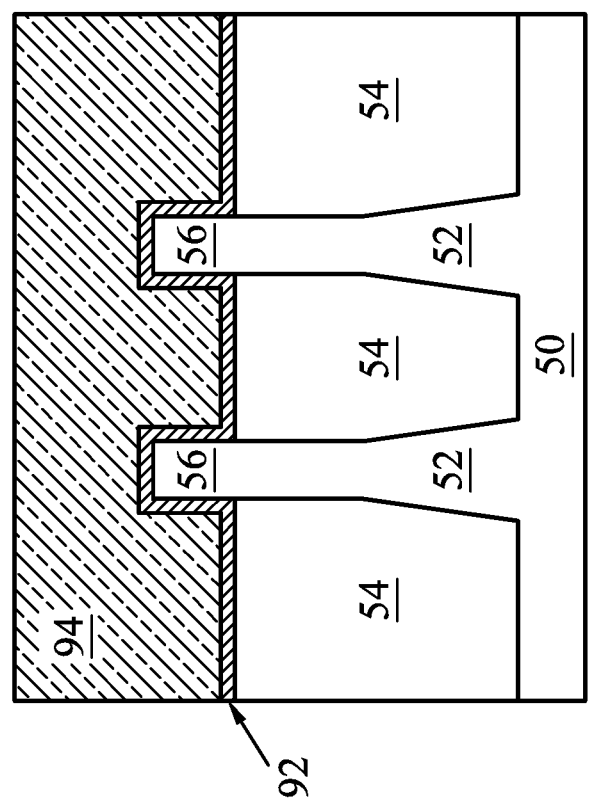
Figure 17B:
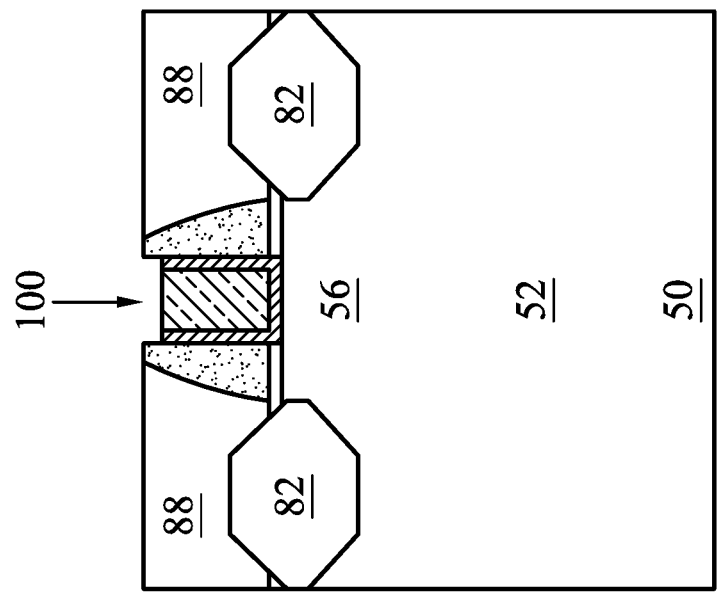

In FIGS. 17A and 17B, the gate dielectric layer 92 and the gate electrode 94 are recessed in an etching step(s), so that recesses 100 are formed. The etching step(s) may include an anisotropic dry etch. For example, the etching step(s) may include a dry etch process using reaction gas(es) that selectively etch the gate dielectric layer 92 and the gate electrode 94 without etching the ILD 88 or the gate spacers 86.

Figure 18A:
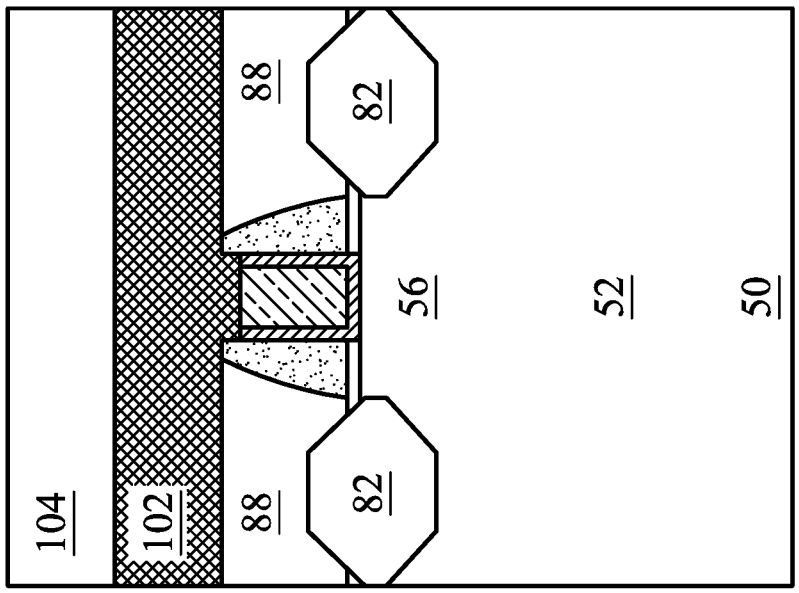
Figure 18B:
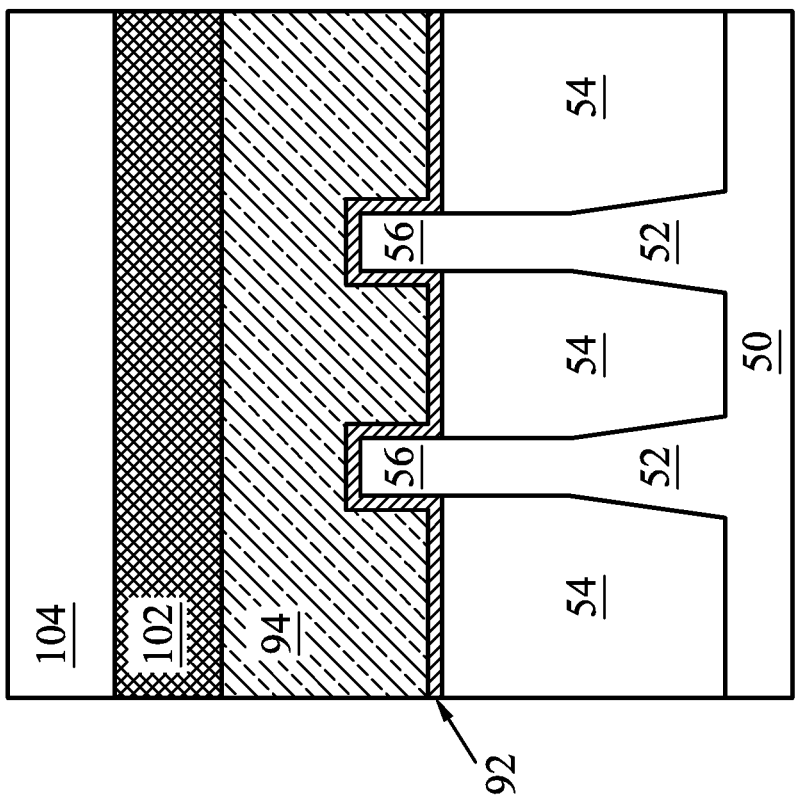

In FIGS. 18A and 18B, a hardmask 102 is formed in the recesses 100, and over the gate dielectric layer 92, the gate electrode 94, and the ILD 88. The hardmask 102 provides protection for the gate spacers 86 during subsequent self-aligned contact etching steps to ensure that the self-aligned contact does not short the gate electrodes 94 to the corresponding epitaxial source/drain regions 82. The hardmask 102 may include one or more oxide (e.g., silicon oxide) and/or nitride (e.g., silicon nitride) layers, and may be formed by CVD, PVD, ALD, PEALD (plasma-enhanced atomic layer deposition), a spin-on-dielectric process, the like, or a combination thereof. In an embodiment, the hardmask 102 is SiN, and is deposited with an ALD process to have a thickness of about 340 Å.

The hardmask 102 may be deposited with the ALD process using the deposition system 200. The wafers 12 (e.g., forming the substrates 50) are placed in the wafer pockets 18 of the collective wafer platter 10. The ALD process is performed to conformally form series of monolayers of the hardmask 102, covering the gate dielectric layer 92, the gate electrode 94, and the ILD 88.

The formation of the hardmask 102 in the deposition system 200 may be initiated by putting a first precursor material into the first precursor delivery system 211. For example, in an embodiment in which the hardmask 102 is silicon nitride, the first precursor material may be a precursor such as hexachlorodisilane ($Si_2Cl_6$) and may be placed into the first precursor delivery system 211. However, as one of ordinary skill in the art will recognize, this precursor is not the only precursor that may be utilized to form a layer of silicon nitride, and the use of hexachlorodisilane is not intended to be limiting to the embodiments. Any suitable precursor material in any suitable phase (solid, liquid, or gas) to form a layer of silicon nitride, such as dichlorosilane, or any other precursor that may be used to form other materials, may be utilized.

Additionally, a second precursor material may be placed into the second precursor delivery system 213. In the embodiment in which a layer of silicon nitride is the desired material for the hardmask 102, the second precursor material may be a precursor material that may contain nitrogen in order to react with the first precursor material to form a monolayer of silicon nitride. For example, in the embodiment in which hexachlorodisilane is utilized as the first precursor material, ammonia ($NH_3$) may be used as the second precursor material and may be placed into the second precursor delivery system 213. However, the description of ammonia as the second precursor material is not intended to be limiting to the embodiments, and any other suitable precursor material, such as $N_2$, or the like, may be utilized as the second precursor material.

Once the first precursor material and the second precursor material have been placed into the first precursor delivery system 211 and the second precursor delivery system 213, respectively, the formation of the hardmask 102 may be initiated by the control unit 227 sending an instruction to the precursor gas controller 225 to connect the first precursor delivery system 211 to the deposition chamber 219. Once connected, the first precursor delivery system 211 can deliver the first precursor material (e.g., the hexachlorodisilane) to the showerhead 231 through the precursor gas controller 225 and the manifold 229. The showerhead 231 can then disperse the first precursor material into the deposition chamber 219, wherein the first precursor material can be adsorbed and react to the exposed surfaces of the gate dielectric layer 92, the gate electrode 94, and the ILD 88.

In the embodiment to form a layer of silicon nitride, the first precursor material may be flowed into the deposition chamber 219 at a flow rate of between about 0.1 standard liters per minute (slm) and about 3 slm for about 12 seconds per cycle. Additionally, the deposition chamber 219 may be held at a pressure of between about 0.1 torr and about 5 torr, such as about 0.5 torr, and a temperature of between about 570° C. and about 650° C. However, as one of ordinary skill in the art will recognize, these process conditions are only intended to be illustrative, as any suitable process conditions may be utilized while remaining within the scope of the embodiments.

As the first precursor material is adsorbed onto the surfaces of the gate stack and the ILD 88, the first precursor material will react with open active sites located on the exposed surfaces. However, once all of the open active sites on the exposed surfaces have reacted with the first precursor material, the reaction will stop, as there are no more open active sites to which the first precursor material will bond. This limitation causes the reaction of the first precursor material with the exposed surfaces of the gate stack to be self-limiting and to form a monolayer of the reacted first precursor material on the surfaces of the gate stack, thereby allowing for a more precise control of the thickness of the hardmask 102.

After the self-limiting reaction has finished, the deposition chamber 219 may be purged of the first precursor material. For example, the control unit 227 may instruct the precursor gas controller 225 to disconnect the first precursor delivery system 211 (containing the first precursor material to be purged from the deposition chamber 219) and to connect a purge gas delivery system 241 to deliver a purge gas to the deposition chamber 219. In an embodiment the purge gas delivery system 241 may be a gaseous tank or other facility that provides a purge gas such as nitrogen, argon, xenon, or other non-reactive gas to the deposition chamber 219. Additionally, the control unit 227 may also initiate the vacuum pump 239 in order to apply a pressure differential to the deposition chamber 219 to aid in the removal of the first precursor material. The purge gas, along with the vacuum pump 239, may purge the first precursor material from the deposition chamber 219 for about 3 seconds.

After the purge of the first precursor material has been completed, the introduction of the second precursor material (e.g., ammonia) to the deposition chamber 219 may be initiated by the control unit 227 sending an instruction to the precursor gas controller 225 to disconnect the purge gas delivery system 241 and to connect the second precursor delivery system 213 (containing the second precursor material) to the deposition chamber 219. Once connected, the second precursor delivery system 213 can deliver the second precursor material to the showerhead 231. The showerhead 231 can then disperse the second precursor material into the deposition chamber 219, wherein the second precursor material can be adsorbed on the exposed surfaces of the gate stack and the ILD 88 and react with the first precursor material in another self-limiting reaction to form a monolayer of the desired material, e.g., silicon nitride, on the exposed surfaces of the gate stack and the ILD 88. In a particular embodiment, the reaction may occur as described below in Equation (1).

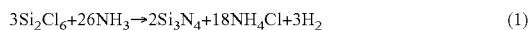

$$3Si_2Cl_6 + 26NH_3 \rightarrow 2Si_3N_4 + 18NH_4Cl + 3H_2 \quad (1)$$

In the embodiment discussed above to form the hardmask 102 of silicon nitride with hexachlorodisilane, the ammonia may be introduced into the deposition chamber 219 at a flow rate of between about 1 slm and about 10 slm, such as about 4.5 slm, for about 30 seconds. Additionally, the deposition chamber 219 may be held at a pressure of between about 1 torr and about 10 torr, such as about 6.98 torr, and a temperature of between about 570° C. and about 650° C. However, as one of ordinary skill in the art will recognize, these process conditions are only intended to be illustrative, as any suitable process conditions may be utilized to introduce the second precursor material while remaining within the scope of the embodiments.

After the monolayer of the desired material, e.g., silicon nitride, has been formed, the deposition chamber 219 may be purged (leaving behind the monolayer of the hardmask 102 on the exposed surfaces) using, e.g., the purge gas from the purge gas delivery system 241 for about three seconds. After the deposition chamber 219 has been purged, a first cycle for the formation of the desired material has been completed, and a second cycle similar to the first cycle may be started. For example, the repeated cycle may introduce the first precursor material, purge with the purge gas, introduce the second precursor material, and purge with the purge gas. These cycles may be repeated until the hardmask 102 has a thickness from about 10 Å to about 10000 Å, such as about 340 Å.

During the first cycle and the second cycle, the wafers 12 may be rotated with the collective wafer platter 10. The rotation may occur in situ, without breaking any vacuum of the deposition chamber 219. The rotation may be continuous such that the collective wafer platter 10 is rotated for the entirety of time that the first cycle and the second cycle are performed and repeated. Each of the individual wafer platters 20 rotate the respective wafer 12 in the respective wafer pockets 18, and the collective wafer platter 10 also rotates. The individual wafer platters 20 rotate around the first axes $R_1$. The collective wafer platter 10 rotates around the second axis $R_2$. As such, the wafers 12 rotate individually in their wafer pockets 18 and collectively about the shaft 14. The individual wafer platters 20 rotate in a first rotational direction about the first axes $R_1$, and the collective wafer platter 10 rotates in a second rotational direction around the second axis $R_2$. In some embodiments, the first rotational direction and the second rotational direction are the same direction. For example, the collective wafer platter 10 and the individual wafer platters 20 may both rotate in a clockwise or counter-clockwise direction. In some embodiments, the first rotational direction is opposite the second rotational direction. For example, the collective wafer platter 10 may rotate in a clockwise direction and the individual wafer platters 20 may rotate in a counter-clockwise direction.

Rotating the wafers 12 about one or more axes may allow the wafers 12 may improve the uniformity of heating in the deposition chamber 219. The wafers 12 may be heated by the susceptor 16 or by heating elements (not shown) in the deposition chamber 219. Rotating the wafers 12 about the first axes $R_1$ and/or the second axis $R_2$ during deposition may more uniformly heat the wafers 12. Heating the wafers 12 more uniformly may improve the plasma density distribution in the deposition chamber 219, allowing the monolayers to be formed more uniformly on the wafers 12. As such, rotating the wafers 12 about the first axes $R_1$ and/or the second axis $R_2$ results in the hardmask 102 being heated in a substantially uniform manner, and thus may have a substantially uniform thickness.

However, as one of ordinary skill in the art will recognize, the above described process to form the hardmask 102 is intended to be illustrative and is not intended to be limiting to the embodiments. Any other suitable process, such as initially introducing the second precursor material (e.g., ammonia), purging with the purge gas, introducing the first precursor material (e.g., hexachlorodisilane), and purging with the purge gas to complete a first cycle and then repeating the first cycle, may be utilized. This and any other suitable process to form the hardmask 102 are fully intended to be included within the scope of the embodiments.

Further in FIGS. 18A and 18B, a dielectric material 104 is formed over the hardmask 102. The dielectric layer material 104 is a buffer layer used in a subsequent planarization process (discussed below). The dielectric material 104 may be formed of a plasma-enhanced oxide (PEOX), a plasma-enhanced SiN (PE-SiN), a plasma-enhanced undoped silicate glass (PE-USG), or the like, and may be formed by a deposition process such as CVD, PVD, PECVD, ALD, PEALD, a spin-on-dielectric process, the like, or a combination thereof. In some embodiments, the dielectric layer material 104 is deposited with an ALD process using the deposition system 200. In an embodiment, the dielectric layer material 104 is a plasma enhanced oxide (PEOX) layer, and is deposited with a PECVD process to have a depth of about 1000 Å.

Figure 19B:
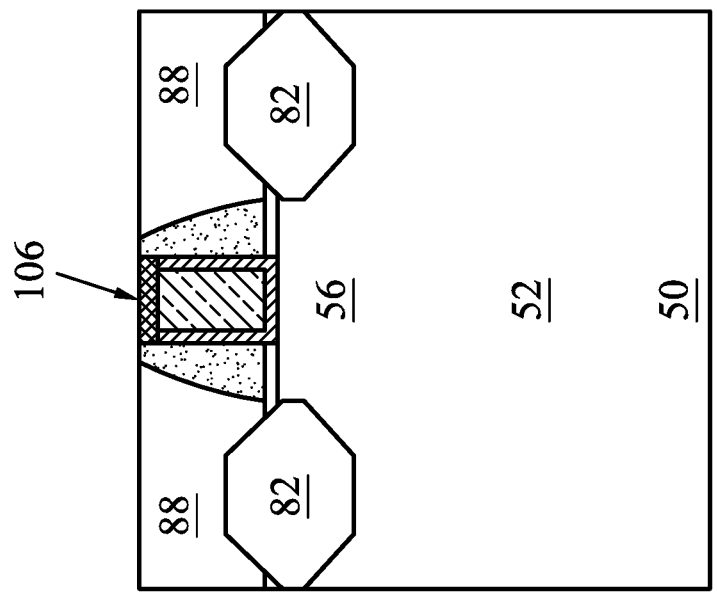
Figure 19A:
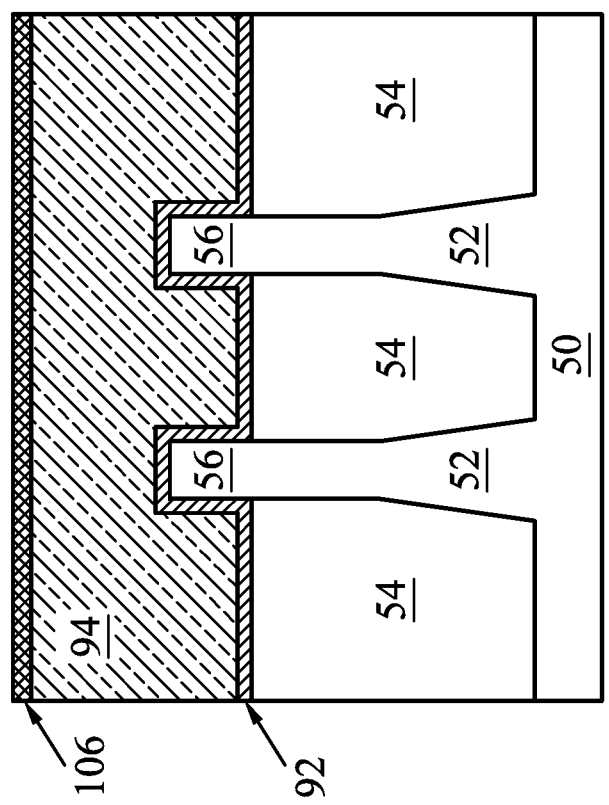

In FIGS. 19A and 19B, a planarization process, such as a CMP, may be performed to level the top surface of the ILD 88 with the top surface of the hardmask 102 and the top surfaces of the gate spacers 86. In embodiments where the planarization process is a CMP, the dielectric layer material 104 acts as a buffer layer to control the amount of material removed by the CMP process. The remaining portions of the hardmask 102 are in the recesses 100, and form a dummy contact material 106 that is self-aligned to the gate stack. The planarization process may also remove the dielectric material 104 on the hardmask 102. Accordingly, the top surfaces of the ILD 88 are exposed, and portions of the hardmask 102 on the top surfaces of the ILD 88 are removed.

Figure 20B:
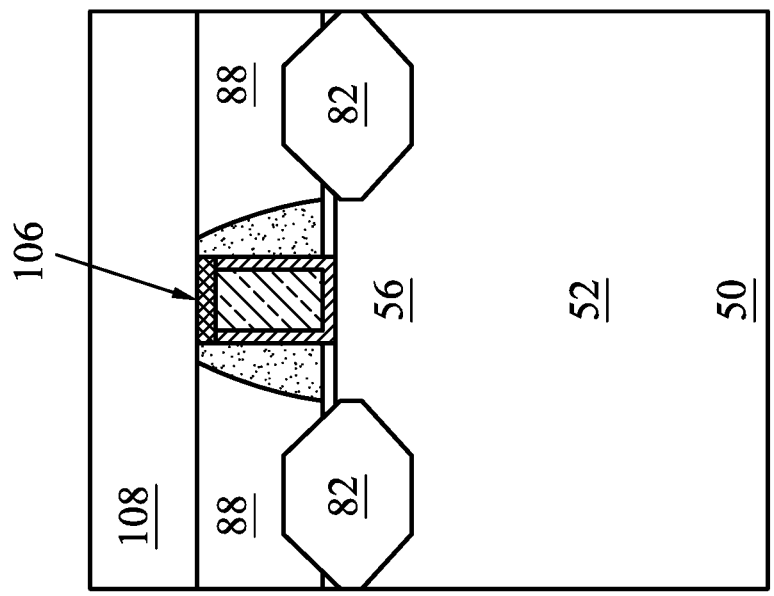
Figure 20A:
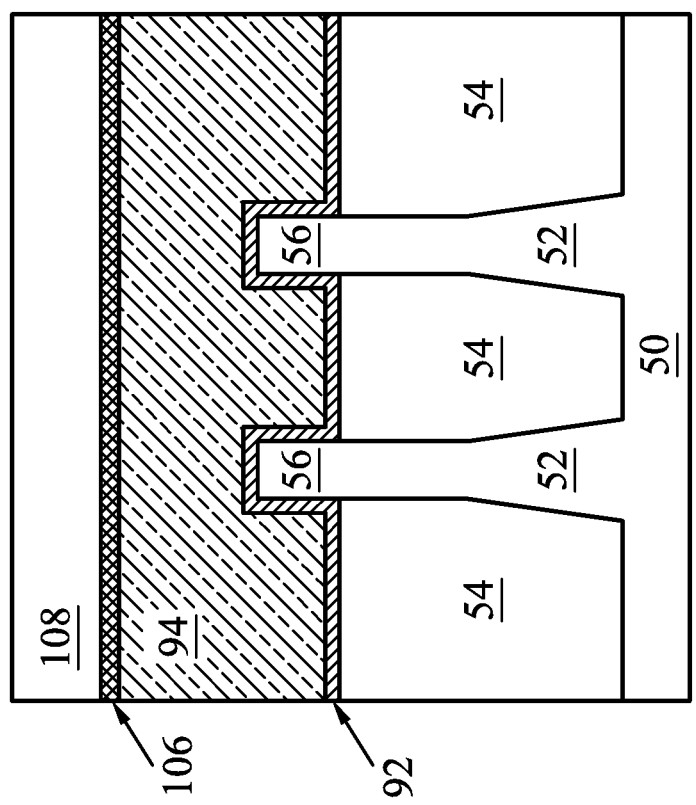

In FIGS. 20A and 20B, an ILD 108 is deposited over the ILD 88 and the dummy contact material 106. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figure 21B:
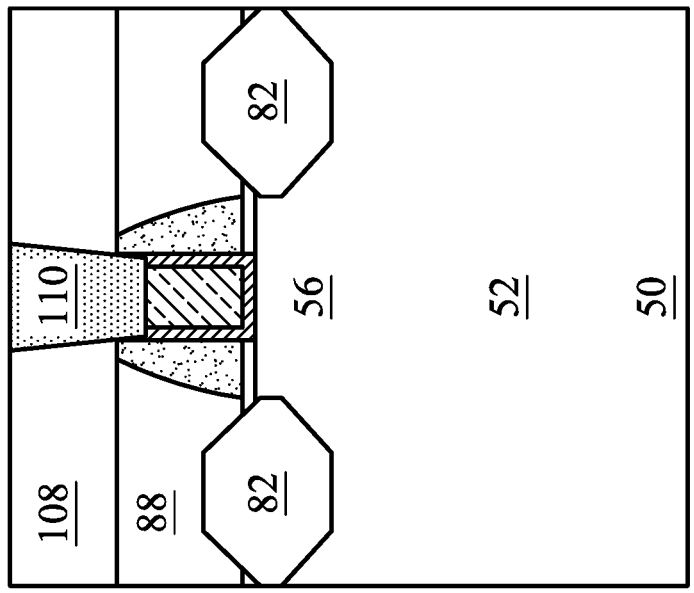
Figure 21A:
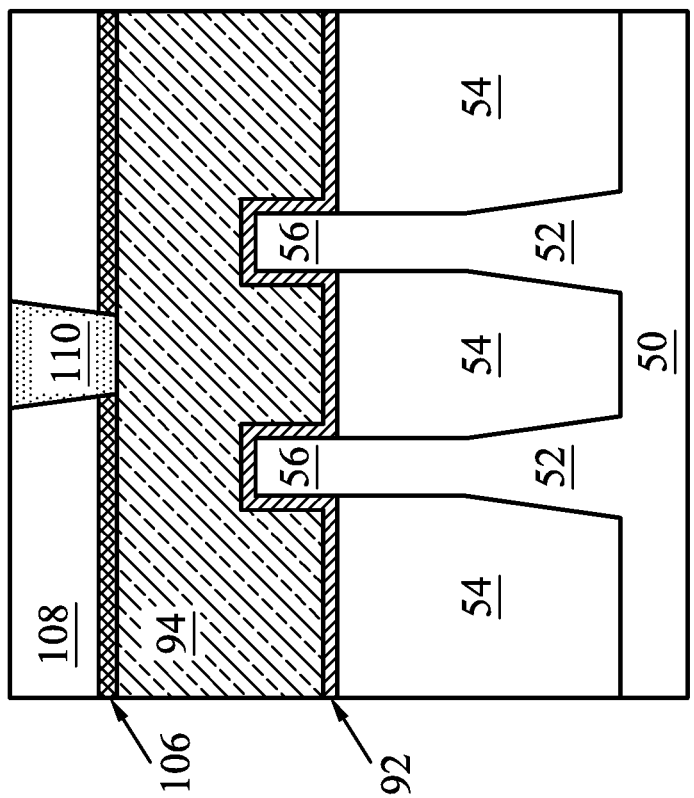

In FIGS. 21A and 21B, portions of the dummy contact material 106 are removed over some of the gate stacks to form openings, and contacts 110 are formed over the gate stacks in place of the removed portions of the dummy contact material 106. It should be appreciated that not all of the dummy contact material 106 is removed. For example, an electronic device such as a transistor may be formed by more than one of the fins 56, and a single contact 110 may be formed electrically contacting all of the gates of the electronic device. As such, a contact 110 may be formed over only one of the gate stacks for the electronic device, and the dummy contact material 106 remaining over the other gate stacks may not be replaced.

The contacts 110 are formed by forming a liner, such as a diffusion barrier layer, an adhesion layer, or the like, and a conductive material in the openings of the dummy contact material 106. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 108. The remaining liner and conductive material form the contacts 120 in the openings of the dummy contact material 106. The contacts 110 are physically and electrically coupled to the gate electrodes 94.

Figure 22B:
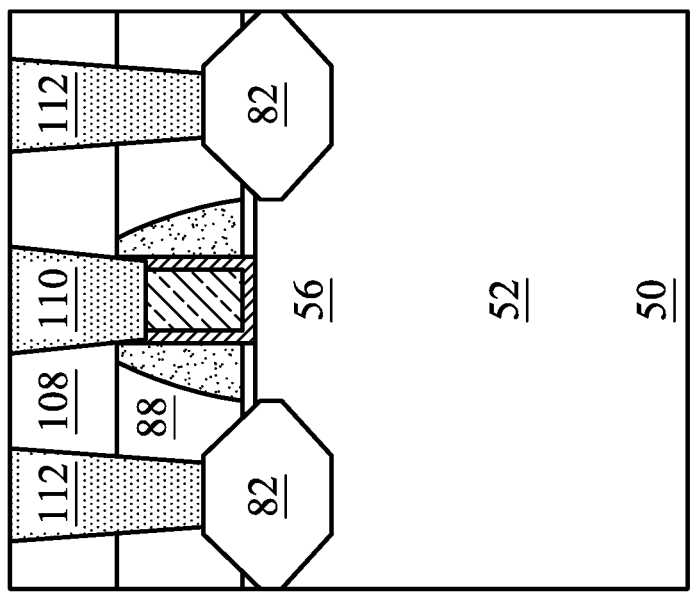
Figure 22A:
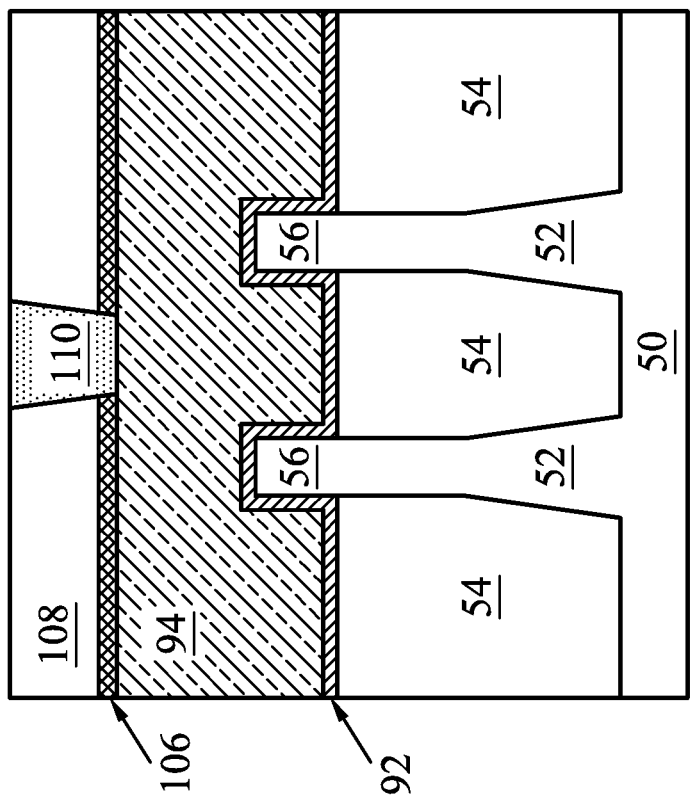

In FIGS. 22A and 22B, contacts 112 are formed through the ILD 108 and the ILD 88. Openings for the contacts 112 are formed through the ILD 88 and the ILD 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 108. The remaining liner and conductive material form the contacts 112 in the openings. An anneal process may be performed to form a silicide at the interface between the epitaxial source/drain regions 82 and the contacts 112. The contacts 112 are physically and electrically coupled to the epitaxial source/drain regions 82.

Embodiments may achieve advantages. Rotating the wafers may result in them being more uniformly heated. Uniformly heating the wafers may improve plasma density distribution in the deposition chamber. An increased plasma density distribution may result in material formed on the wafers with an ALD process having a thickness that is as much as 46% more uniform over the area of the wafers compared to ALD processes with non-uniform heating. Rotating the wafers in situ on a platter may avoid any tooling downtime incurred by pausing the ALD to manually rotate the platters.

An embodiment is an apparatus. The apparatus includes: a collective wafer platter including a plurality of individual wafer pockets, the individual wafer pockets having respective individual wafer platters, the individual wafer platters configured to rotate around respective first axes, the collective wafer platter configured to rotate around a second axis; a motor coupled to the collective wafer platter; and a control unit configured to control the motor such that the individual wafer platters rotate around the respective first axes, and the collective wafer platter rotates around the second axis.

An embodiment is an apparatus. The apparatus includes: a susceptor coupled to a shaft, the susceptor having wafer pockets; wafer platters disposed in respective wafer pockets on a first side of the susceptor; individual susceptor gears coupled to respective wafer platters on a second side of the susceptor; and a collective susceptor gear coupled to the shaft on the second side of the susceptor, the collective susceptor gear configured to rotate around the shaft, the individual susceptor gears mechanically and physically coupled to the collective susceptor gear.

An embodiment is a method. The method includes: dispensing a plurality of precursor materials over a collective wafer platter holding a plurality of wafers; heating the collective wafer platter while dispensing the precursor materials; rotating the collective wafer platter around a first axis while dispensing the precursor materials and heating the collective wafer platter; rotating the wafers around respective second axes while dispensing the precursor materials and heating the collective wafer platter, the first axis different from each of the second axes; and singulating integrated circuit devices from each of the wafers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
a collective wafer platter comprising a plurality of individual wafer pockets, the individual wafer pockets having respective individual wafer platters, the individual wafer platters configured to rotate around respective first axes, the collective wafer platter configured to rotate around a second axis, and seals disposed respectively between the individual wafer platters and the collective wafer platter, the individual wafer pockets having spaces bounded by the seals, mounts of the individual wafer platters, bottom surfaces of the individual wafer platters, and top surfaces of the collective wafer platter, the spaces having heights equal to the heights of the seals, the spaces opening on holes containing the mounts of the individual wafer platters;

a motor coupled to the collective wafer platter; and a control unit configured to control the motor such that the individual wafer platters rotate around the respective first axes, and the collective wafer platter rotates around the second axis.

2. The apparatus of claim 1, wherein the collective wafer platter and the individual wafer platters rotate in the same direction.

3. The apparatus of claim 1, wherein the collective wafer platter and the individual wafer platters rotate in different directions.

4. The apparatus of claim 1, wherein the collective wafer platter comprises:
individual susceptor gears coupled to the individual wafer platters; and
a collective susceptor gear coupled to the collective wafer platter, each of the individual susceptor gears mechanically coupled to the collective susceptor gear.

5. The apparatus of claim 4, wherein the first axes are perpendicular to major surfaces of the individual susceptor gears, and the second axis is perpendicular to a major surface of the collective susceptor gear.

6. The apparatus of claim 5, wherein the motor is connected to the collective susceptor gear and rotates the collective susceptor gear.

7. The apparatus of claim 5, wherein the motor is connected to the individual susceptor gears and rotates the individual susceptor gears.

8. The apparatus of claim 1, further comprising:
a deposition chamber, the collective wafer platter disposed in the deposition chamber; and
a showerhead configured to dispense one or more precursor materials over the collective wafer platter.

9. The apparatus of claim 8, wherein the control unit is configured to rotate the collective wafer platter and the individual wafer platters while the showerhead dispenses the one or more precursor materials over the collective wafer platter.

10. The apparatus of claim 9, wherein the collective wafer platter is rotated without breaking a vacuum in the deposition chamber while the showerhead dispenses the one or more precursor materials over the collective wafer platter.

11. The apparatus of claim 9, wherein the collective wafer platter is rotated continuously while the showerhead dispenses the one or more precursor materials over the collective wafer platter.

12. The apparatus of claim 8, wherein the collective wafer platter comprises a susceptor, and control unit is configured to have the susceptor heat the collective wafer platter while the showerhead dispenses the one or more precursor materials over the collective wafer platter.

13. The apparatus of claim 1, wherein the collective wafer platter and the individual wafer platters can be configured to rotate in the same direction or in opposite directions.

14. An apparatus comprising:
a susceptor coupled to a shaft, the susceptor having wafer pockets;
wafer platters disposed in respective wafer pockets on a first side of the susceptor, the wafer pockets having respective seals disposed between the wafer platters and the susceptor, the respective seals configured to prevent processing gases from escaping from respective bottoms of the wafer pockets, the respective wafer pockets having respective spaces bounded by the respective seals, respective mounts of the wafer platters, bottom surfaces of the wafer platters, and top surfaces of the susceptor, the respective spaces having heights equal to the heights of the respective seals, the respective spaces opening on respective holes containing the respective mounts of the wafer platters, the respective holes extending to a bottom surface of the susceptor;
individual susceptor gears coupled to respective wafer platters on a second side of the susceptor; and
a collective susceptor gear coupled to the shaft on the second side of the susceptor, the collective susceptor gear configured to rotate around the shaft, the individual susceptor gears mechanically and physically coupled to the collective susceptor gear.

15. The apparatus of claim 14, further comprising fasteners coupling the collective susceptor gear to the shaft.

16. The apparatus of claim 14, wherein each of the wafer platters comprises isolators extending above a top surface of the wafer platters.

17. An apparatus comprising:
a shaft;
a susceptor coupled to the shaft, the susceptor having a first side and a second side opposite the first side, a wafer pocket on the first side of the susceptor, a hole extending through the susceptor from a bottom surface of the wafer pocket to the second side of the susceptor, the bottom surface of the wafer pocket being flat and unbroken between the hole and the outer sidewall of the wafer pocket;
a chuck disposed adjacent the first side of the susceptor in the wafer pocket, the chuck having a radius measured from the center of the chuck to an outer sidewall of the chuck;
a first gear disposed adjacent the second side of the susceptor, the first gear coupled to the shaft;
a second gear mechanically connecting the first gear to the chuck, a mount extending from the second gear to the bottom surface of the chuck;
a seal disposed between the chuck and the susceptor, the seal configured to prevent processing gases from escaping from a bottom of the wafer pocket, the wafer pocket having a space bounded by the seal, the mount, the bottom surface of the chuck, and the bottom surface of the wafer pocket, the space having a height equal to the height of the seal, the space opening on the hole, the space having a radius measured from the seal to the mount, the radius of the space being greater than half of the radius of the chuck;
a motor coupled to the first gear; and
a control unit configured to control the motor to rotate the susceptor and the first gear in a first direction around the shaft, the first gear rotating the second gear in a second direction when the first gear rotates in the first direction, the chuck rotating in the second direction when the second gear rotates in the second direction.

18. The apparatus of claim 17, further comprising:
a showerhead disposed over the susceptor; and
a gas source, the control unit further configured to control the gas source to dispense precursor materials through the showerhead while controlling the motor.

19. The apparatus of claim 18, further comprising:
an energy source, the control unit further configured to control the energy source to heat the susceptor while controlling the gas source and the motor.

20. The apparatus of claim 19, further comprising:
a deposition chamber housing the susceptor, the deposition chamber having an exhaust outlet connected to a vacuum pump.

* * * * *